United States Patent
Montgomery et al.

(10) Patent No.: US 12,130,677 B2
(45) Date of Patent: Oct. 29, 2024

(54) MULTI-DEVICE-CHASSIS/DEVICE MOVABLE COUPLING LIQUID COOLING SYSTEM

(71) Applicant: Dell Products L.P., Round Rock, TX (US)

(72) Inventors: Colin Montgomery, Mountain View, CA (US); Shree Rathinasamy, Round Rock, TX (US); Neal Beard, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 215 days.

(21) Appl. No.: 17/715,235

(22) Filed: Apr. 7, 2022

(65) Prior Publication Data

US 2023/0324964 A1   Oct. 12, 2023

(51) Int. Cl.
*G06F 1/20* (2006.01)
*G06F 1/18* (2006.01)
*H05K 7/20* (2006.01)

(52) U.S. Cl.
CPC ............... *G06F 1/20* (2013.01); *G06F 1/181* (2013.01); *H05K 7/20263* (2013.01); *G06F 2200/201* (2013.01)

(58) Field of Classification Search
CPC ...... G06F 1/20; G06F 1/181; G06F 2200/201; H05K 7/20263
See application file for complete search history.

(56) References Cited

U.S. PATENT DOCUMENTS

| | | | | |
|---|---|---|---|---|
| 5,818,692 A | * | 10/1998 | Denney, Jr. | ........... H01L 23/473 361/720 |
| 6,519,955 B2 | * | 2/2003 | Marsala | ................ H01L 23/427 257/E23.098 |
| 6,828,675 B2 | * | 12/2004 | Memory | ............... F28D 7/0025 257/714 |
| 7,907,409 B2 | | 3/2011 | Wyatt et al. | |
| 8,179,677 B2 | * | 5/2012 | Campbell | .............. H05K 7/203 174/15.1 |
| 8,582,298 B2 | * | 11/2013 | Facusse | ............. H05K 7/20418 361/752 |

(Continued)

*Primary Examiner* — Anthony Q Edwards
*Assistant Examiner* — Hung Q Dang
(74) *Attorney, Agent, or Firm* — Joseph Mencher

(57) ABSTRACT

A computing device liquid cooling system includes a multi-device chassis, a computing device, and a multi-device-chassis/device movable coupling liquid cooling system that moveably couples the computing device to the multi-device chassis. The multi-device-chassis/device movable coupling liquid cooling system includes a computing device mounting element that is mounted to the computing device and configured to transfer heat generated by the computing device, a multi-device chassis mounting element that includes a liquid cooling subsystem and that is mounted to the multi-device chassis, and a movable coupling that is configured to allow the computing device mounting element to move relative to the multi-device chassis mounting element. The multi-device chassis mounting element is configured to receive the heat generated by the computing device and transferred by the computing device mounting element, and transfer the heat received from the computing device mounting element using the liquid cooling subsystem.

20 Claims, 13 Drawing Sheets

(56) References Cited

U.S. PATENT DOCUMENTS

| | | | |
|---|---|---|---|
| 9,803,937 B2 * | 10/2017 | Franz | H01L 23/473 |
| 9,927,187 B2 * | 3/2018 | Moore | H01L 23/473 |
| 10,785,897 B2 | 9/2020 | Lipp et al. | |
| 11,109,517 B2 * | 8/2021 | Farshchian | H05K 7/20672 |

* cited by examiner

MULTI-DEVICE-CHASSIS/DEVICE MOVABLE COUPLING LIQUID COOLING SYSTEM

BACKGROUND

The present disclosure relates generally to information handling systems, and more particularly to providing liquid cooling for information handling systems via a movable coupling between the information handling system and a multi-device chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as server devices, networking devices (e.g., switch devices), storage systems, and/or other computing devices known in the art, are often included in multi-device chassis such as racks in a datacenter. Furthermore, as the functionality of computing devices steadily continues to increase, corresponding heat production by those computing devices is increasing as well. Thus, as the number/density of such computing devices utilized in racks/datacenters increases, the cooling of those computing devices becomes a concern. One solution to cool such computing devices is to provide liquid cooling systems in those computing devices, but such solutions have issues. For example, liquid cooling systems tend to require a relatively large volume in computing devices, thus increasing the size of those computing devices. Furthermore, liquid cooling systems tend to be power and cost inefficient, particularly when provided in individual computing devices. Further still, in the event a liquid cooling system in an individual computing device leaks, relatively extensive damage may occur in that computing device and in adjacent computing devices in the same rack, as liquid leaking from a liquid cooling system in an individual computing device may be difficult to identify, collect, and contain from adjacent computing devices.

Accordingly, it would be desirable to provide a liquid cooling system for computing devices in a multi-device chassis that addresses the issues discussed above.

SUMMARY

According to one embodiment, a multi-device-chassis/device movable coupling liquid cooling system includes a computing device mounting element that is configured to mount to a computing device and to transfer heat generated by the computing device; a multi-device chassis mounting element includes a liquid cooling subsystem and that is configured to mount to a multi-device chassis, wherein the multi-device chassis mounting element is configured to: receive, from the computing device mounting element, the heat generated by the computing device and transferred by the computing device mounting element; and transfer the heat received from the computing device mounting element using the liquid cooling subsystem; and a movable coupling that is configured to allow the computing device mounting element to move relative to the multi-device chassis mounting element.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
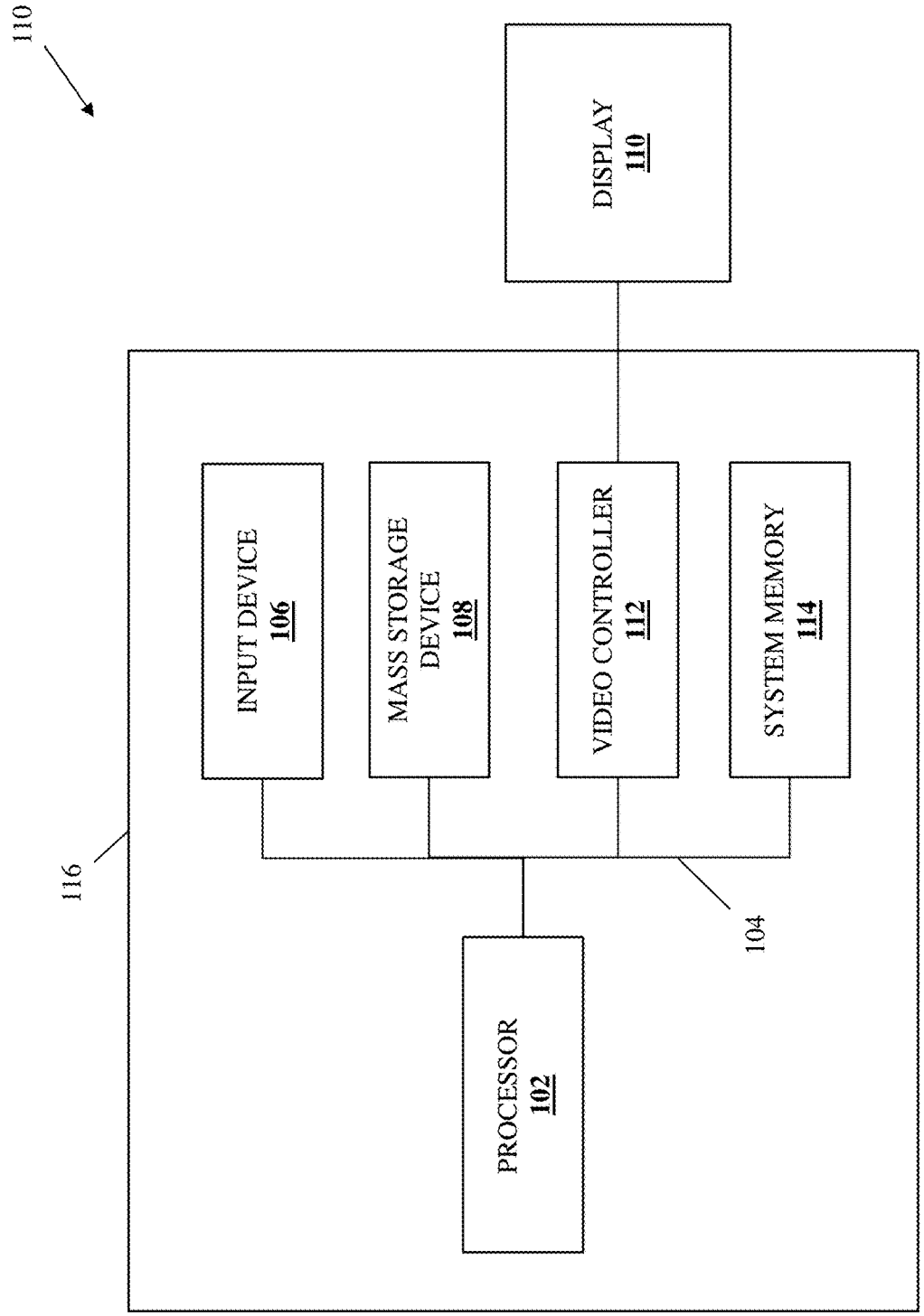
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
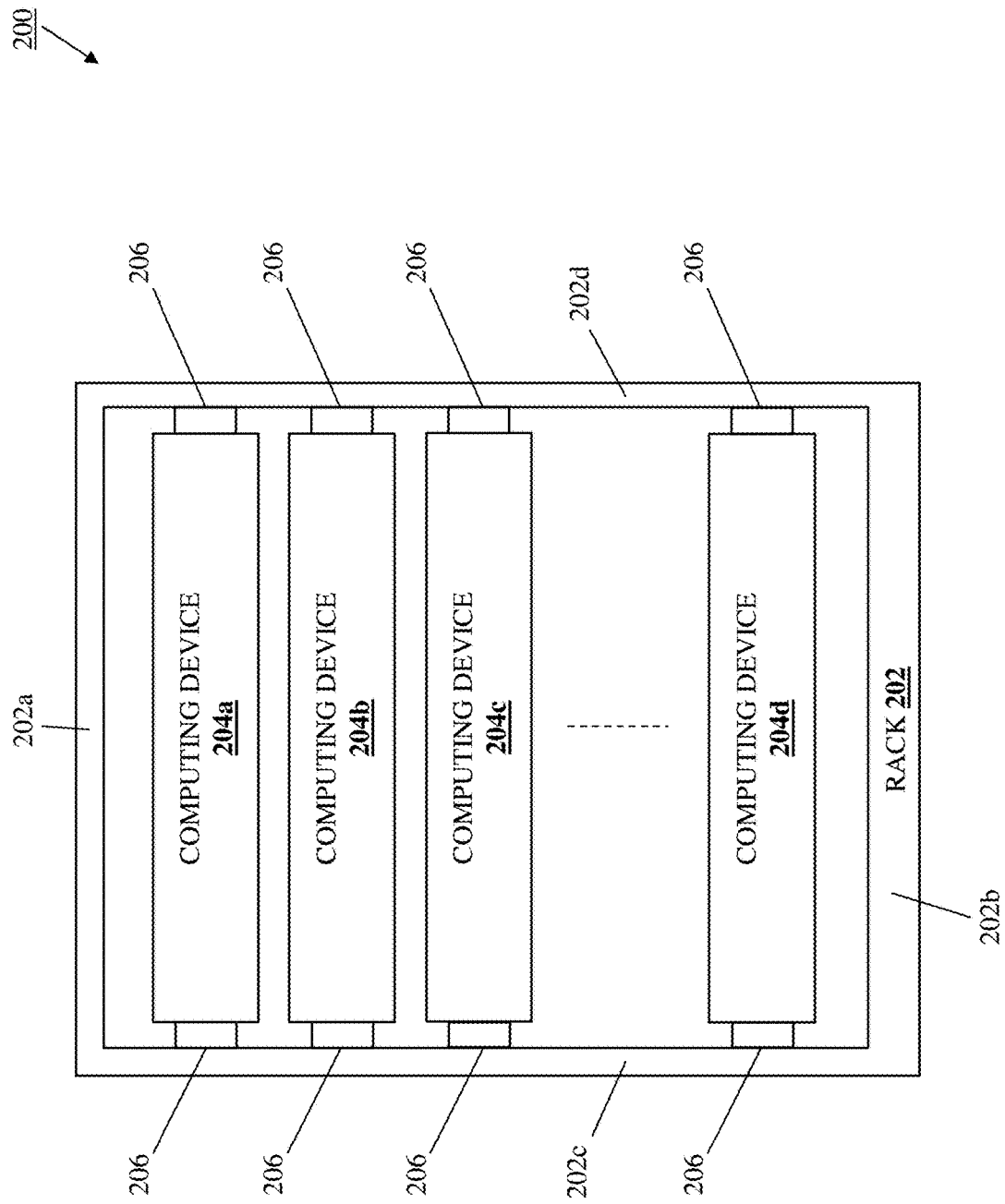
FIG. 2 is a schematic view illustrating an embodiment of a multi-device chassis housing a plurality of computing devices.

Referring now to FIG. 2, an embodiment of a multi-device chassis 200 is illustrated. In the illustrated embodiment, the multi-device chassis 200 is provided by a rack 202 having a top wall 202a, a bottom wall 202b that is located opposite the rack 202 from the top wall 202a, and a pair of side walls 202c and 202c that extend between the top wall 202a and the bottom wall 202b and that are located opposite the rack 202 from each other. However, while illustrated and described as a rack, one of skill in the art in possession of the present disclosure will appreciate how the multi-device chassis may be provided by a variety of other chassis that are configured to house multiple computing devices while remaining within the scope of the present disclosure as well. As illustrated, a plurality of computing devices 204a, 204b, 204c, and up to 204d may be housed in the rack 202. In an embodiment, any of all of the computing devices 204a-204d may be provided by the IHS 100 discussed above with reference to FIG. 1, and/or may include some or all of the components of the IHS 100, and in the specific examples below are described as being provided by server devices and networking devices such as switch devices. However, while illustrated and discussed as being provided by server devices and switch devices, one of skill in the art in possession of the present disclosure will recognize that computing device provided in the multi-device chassis 200 may include any devices or systems (e.g., storage systems) that may be configured to operate similarly as the server devices and switch devices discussed below.

As illustrated in FIG. 2, each of the computing devices 204a-204d may be coupled to the rack by respective a multi-device-chassis/device movable coupling liquid cooling system 206 that, in the illustrated example, are each provided by a pair of multi-device-chassis/device movable coupling liquid cooling subsystems: a first multi-device-chassis/device movable coupling liquid cooling subsystem that engages a first side of the computing device and the side wall 202c of the rack 202, and a second multi-device-chassis/device movable coupling liquid cooling subsystem that engages a second side of the computing device (which is opposite the first side of the computing device) and the side wall 202d of the rack 202. However, while a specific multi-device chassis 200 has been illustrated and described, one of skill in the art in possession of the present disclosure will recognize that the multi-device-chassis/device movable coupling liquid cooling system of the present disclosure may be utilized in a variety of multi-device chassis while remaining within the scope of the present disclosure as well.

Figure 3:
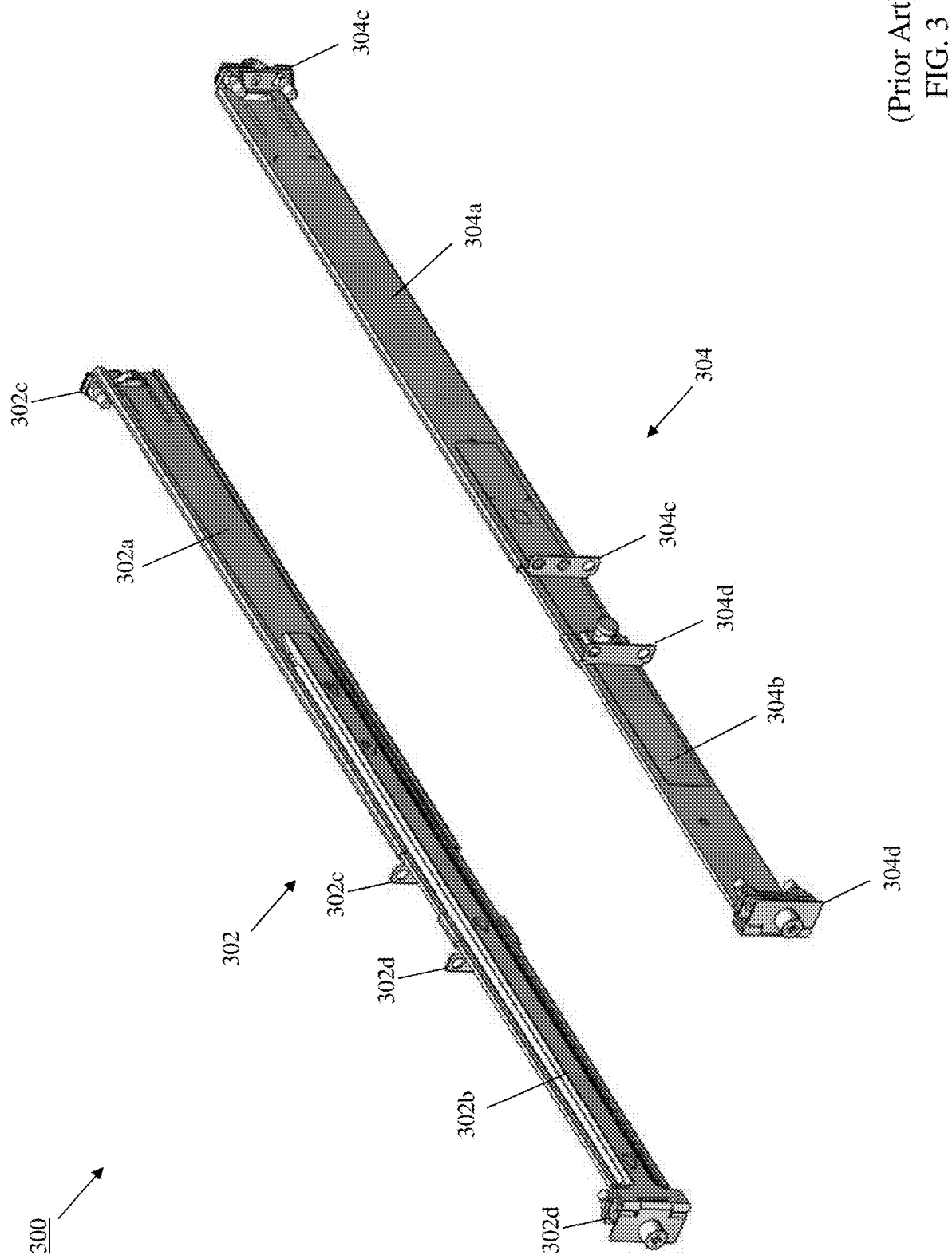
FIG. 3 is a schematic view illustrating an embodiment of a conventional multi-device-chassis/device movable coupling system.

Referring now to FIG. 3, an embodiment of a conventional multi-device-chassis/device movable coupling system 300 is illustrated for the purposes of describing some of the functionality provided by embodiments of the multi-device-chassis/device movable coupling liquid cooling system of the present disclosure. As will be appreciated by one of skill in the art in possession of the present disclosure, conventional multi-device-chassis/device movable coupling system 300 provides a "slidable rail" rack/device coupling system such as the DELL® READY RAIL® rack/device coupling system available from DELL® Inc. of Round Rock, Texas, United States. In the illustrated embodiment, the conventional multi-device-chassis/device movable coupling system 300 includes a pair of rail subsystem 302 and 304. The rail subsystem 302 includes a multi-device chassis mounting element 302a that is moveably coupled to a computing device mounting element 302b via a telescoping slidable coupling (visible approximately midway along the length of the rail subsystem 302 in FIG. 3), and the rail subsystem 304 includes a multi-device chassis mounting element 304a that is moveably coupled to a computing device mounting element 304b via a telescoping slidable coupling (visible approximately midway along the length of the rail subsystem 304 in FIG. 3).

As will be appreciated by one of skill in the art in possession of the present disclosure, the multi-device chassis mounting elements 302a and 304a on the rail subsystems 302 and 304, respectively, may be mounted to opposite side walls on a rack (e.g., the side walls 202c and 202d on the rack 202) using rack mounting features 302c and 304c, respectively. Furthermore, the computing device mounting elements 302b and 304b on the rail subsystems 302 and 304, respectively, may be mounted to opposite sides on a computing device using computing device mounting features 302d and 304d, respectively. With the rail subsystems 302 and 304 coupled to both the rack and a computing device as described above, that computing device is configured to move relative to the rack via the telescoping slidable couplings provided by the rail subsystems 302 and 304, and may be slid in and out of the rack via the rail subsystems 302 and 304.

Figure 4:
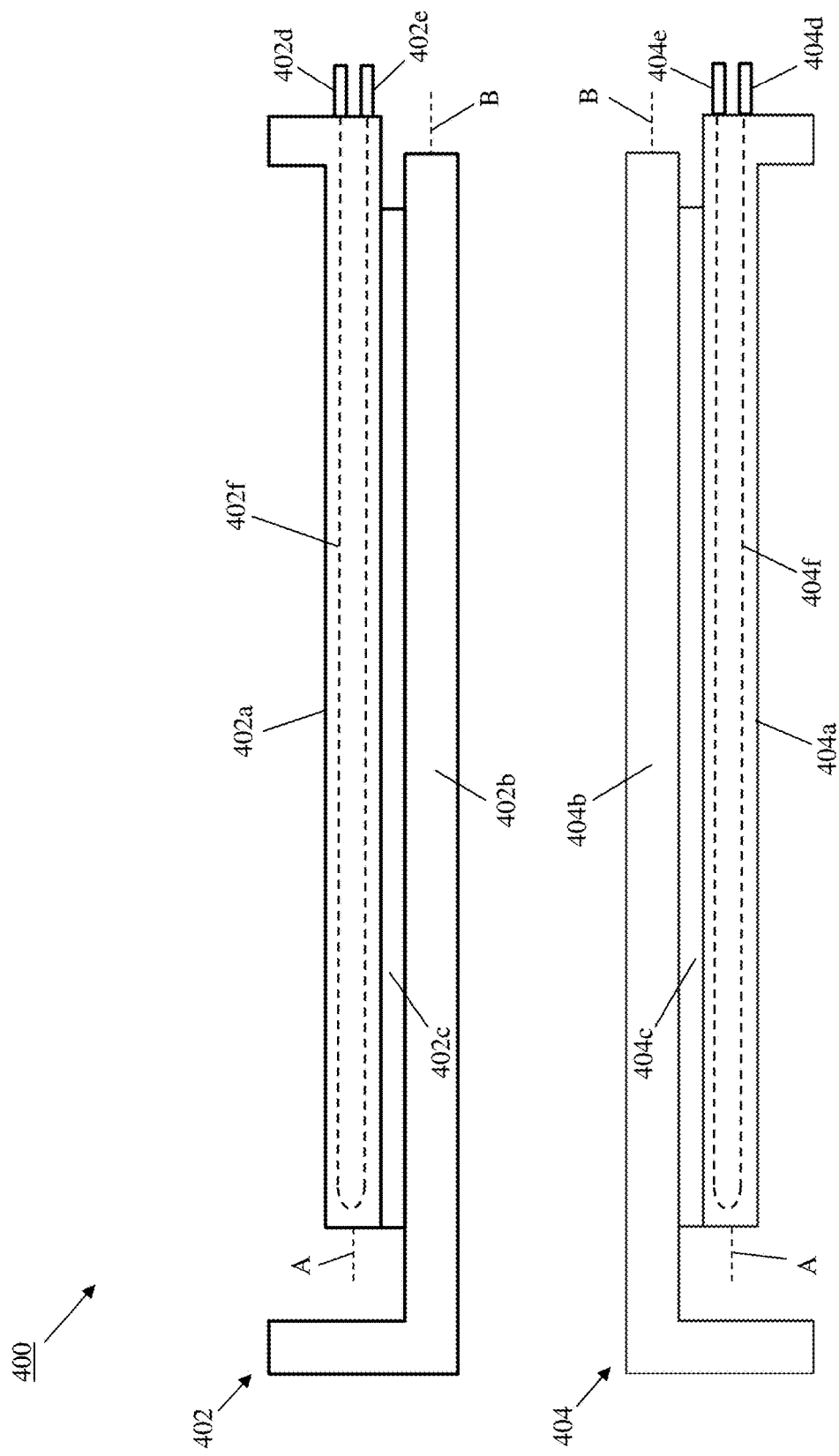
FIG. 4 is a schematic view illustrating an embodiment of a multi-device-chassis/device movable coupling liquid cooling system provided according to the teachings of the present disclosure.

Referring now to FIG. 4, an embodiment of a multi-device-chassis/device movable coupling liquid cooling system 400 is illustrated. In the illustrated embodiment, the multi-device-chassis/device movable coupling liquid cooling system 400 includes a pair of multi-device-chassis/device movable coupling liquid cooling subsystems 402 and 404. The multi-device-chassis/device movable coupling liquid cooling subsystem 402 includes a multi-device chassis mounting element 402a that is coupled to a computing device mounting element 402b via a thermal interface material 402c, and as discussed below a movable coupling is provided between the multi-device chassis mounting element 402a and the computing device mounting element 402b in order to allow the computing device mounting element 402b to move relative to the multi-device chassis mounting element 402a. Furthermore, a liquid cooling subsystem is provided in the multi-device chassis mounting element 402a, and is illustrated as including a liquid inlet 402d and a liquid outlet 402e that extend from the multi-device chassis mounting element 402a and that are coupled together by a liquid conduit 402f that is defined by the multi-device chassis mounting element 402a and extends through the multi-device chassis mounting element 402a (as illustrated by the dashed line in FIG. 4). Further still, an axis A is associated with the multi-device chassis mounting element 402a and an axis B is associated with the computing device mounting element 402b, with the axes A and B utilized below to describe the relative movement of the computing device mounting element 402b and the multi-device chassis mounting element 402a.

Similarly, the multi-device-chassis/device movable coupling liquid cooling subsystem 404 includes a multi-device chassis mounting element 404a that is coupled to a computing device mounting element 404b via a thermal interface material 404c, and as discussed below a movable coupling is provided between the multi-device chassis mounting element 404a and the computing device mounting element 404b in order to allow the computing device mounting element 404b to move relative to the multi-device chassis mounting element 404a. Furthermore, a liquid cooling subsystem is provided in the multi-device chassis mounting element 404a, and is illustrated as including a liquid inlet 404d and a liquid outlet 404e that extend from the multi-device chassis mounting element 404a and that are coupled together by a liquid conduit 404f that is defined by the multi-device chassis mounting element 404a and extends through the multi-device chassis mounting element 404a (as illustrated by the dashed line in FIG. 4). Further still, an axis A is associated with the multi-device chassis mounting element 404a and an axis B is associated with the computing device mounting element 404b, with the axes A and B utilized below to describe the relative movement of the computing device mounting element 404b and the multi-device chassis mounting element 404a.

While not illustrated, one of skill in the art in possession of the present disclosure will appreciate how the multi-device-chassis/device movable coupling liquid cooling subsystems 402 and 404 may also include features for mounting the multi-device chassis mounting elements 402a/404a to the multi-device chassis as described below, and features for mounting the computing device mounting elements 402b/404b to the computing device as discussed below, and in a specific example those features may be similar to those described above with reference to the conventional multi-device-chassis/device movable coupling system 300 of FIG. 3. In a specific example, the heat transfer components of the multi-device-chassis/device movable coupling liquid cooling subsystems 402 and 404 may be provided using materials (e.g., "cold plates" made from materials such as copper, aluminum, and/or other heat transfer materials that would be apparent to one of skill in the art in possession of the present disclosure) that are conducive to heat transfer and that have dimensions that provide for a desired level of heat transfer.

For example, one of skill in the art in possession of the present disclosure will appreciate how the computing device mounting elements 402b and 404b and the multi-device chassis mounting elements 402a and 404a on the multi-device-chassis/device movable coupling liquid cooling subsystems 402 and 404 may be provided with relatively larger dimensions than the computing device mounting elements 302b and 304b and the multi-device chassis mounting elements 302a and 304a on the conventional multi-device-chassis/device movable coupling system 300, but may allow smaller computing devices (e.g., due to the ability to remove cooling subsystems from those computing device) to be provided in a multi-device chassis, and thus the computing device liquid cooling system of the present disclosure may not require additional space in racks or other multi-device chassis. However, while a specific multi-device-chassis/device movable coupling liquid cooling system 400 has been illustrated and described, one of skill in the art in possession of the present disclosure will appreciate how other configurations of the multi-device-chassis/device movable coupling liquid cooling system may be provided according to the teachings of the present disclosure while remaining within its scope.

Figure 5:
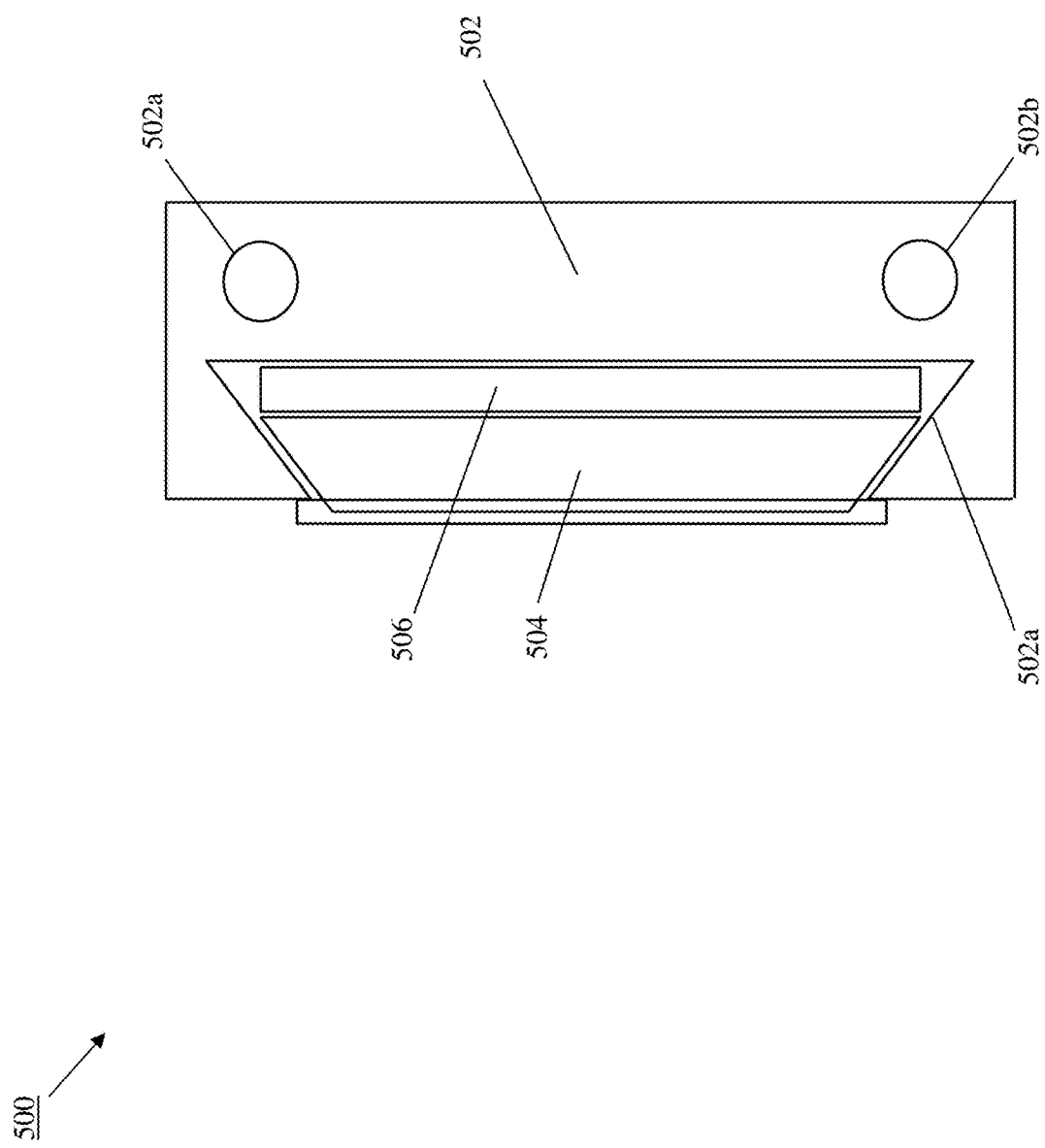
FIG. 5 is a schematic view illustrating an embodiment of a movable coupling included in the multi-device-chassis/device movable coupling liquid cooling system of FIG. 4.

Referring now to FIG. 5, an embodiment of a movable coupling 500 is illustrated that may provide the movable couplings that are discussed above as providing for relative movement between the multi-device chassis mounting element 402a and the computing device mounting element 402b, and/or between the multi-device chassis mounting element 404a and the computing device mounting element 404b. In the illustrated embodiment, the movable coupling 500 includes a multi-device chassis mounting element 502 that may provide either of the multi-device chassis mounting elements 402a/404a discussed above, and the multi-device chassis mounting element 502 defines a movable coupling channel 502a, while including a liquid inlet 502b and a liquid outlet 502b that may be coupled together by a liquid conduit that is defined by the multi-device chassis mounting element 502 (e.g., similar to the liquid inlet 402d, liquid outlet 402e, and liquid conduit 402f provided with the multi-device chassis mounting element 402a discussed above, and the liquid inlet 404d, liquid outlet 404e, and liquid conduit 404f provided with the multi-device chassis mounting element 404a discussed above).

The movable coupling 500 also includes a computing device mounting element 504 that may provide either of the computing device mounting elements 402b/404b discussed above, and that is positioned in the movable coupling channel 502a that is defined by the multi-device chassis mounting element 502. The movable coupling 500 also includes a thermal interface material 506 that may provide either of the thermal interface materials 402c/404c discussed above, and that is positioned between the multi-device chassis mounting element 502 and the computing device mounting element 504 and in the movable coupling channel 502a defined by the multi-device chassis mounting element 502. As will be appreciated by one of skill in the art in possession of the present disclosure, the computing device mounting element 504 may be configured in a variety of manners to move relative to the multi-device chassis mounting element 502 and through the movable coupling channel 502a defined by the multi-device chassis mounting element 502.

For example, computing device mounting element 504, the multi-device chassis mounting element 502, and in some cases the thermal interface material 506, may be provided with relatively low friction surfaces that allow for relative movement of the computing device mounting element 504 and the multi-device chassis mounting element 502. In the specific examples provided below, the computing device mounting element 504 is illustrated and described as moving relative to the thermal interface material 506 and the multi-device chassis mounting element 502, and one of skill in the art in possession of the present disclosure will appreciate how a variety of relatively low friction surfaces may be provided to enable such movement. Furthermore, in other examples the computing device mounting element 504 and the thermal interface material 506 may move relative to the multi-device chassis mounting element 502, and one of skill in the art in possession of the present disclosure will appreciate how a variety of relatively low friction surfaces may be provided to enable such movement as well.

In another example, mechanical relative movement systems (e.g., ball bearings, rollers, etc.) may be provided to enable relative movement of the computing device mounting element 504 and the multi-device chassis mounting element 502, either with the computing device mounting element 504 moving relative to the thermal interface material 506 and the multi-device chassis mounting element 502, or the computing device mounting element 504 and the thermal interface material 506 moving relative to the multi-device chassis mounting element 502, and one of skill in the art in possession of the present disclosure will appreciate how a variety of mechanical relative movement systems may be provided to enable such movement. However, while a specific movable coupling 500 is illustrated and described as utilizing specific techniques for providing relative movement, one of skill in the art in possession of the present disclosure will appreciate that a variety of movable couplings and relative movement systems may be utilized with the teachings of the present disclosure in order to enable the functionality described below, and thus are envisioned as falling within the scope of the present disclosure.

Figure 6:
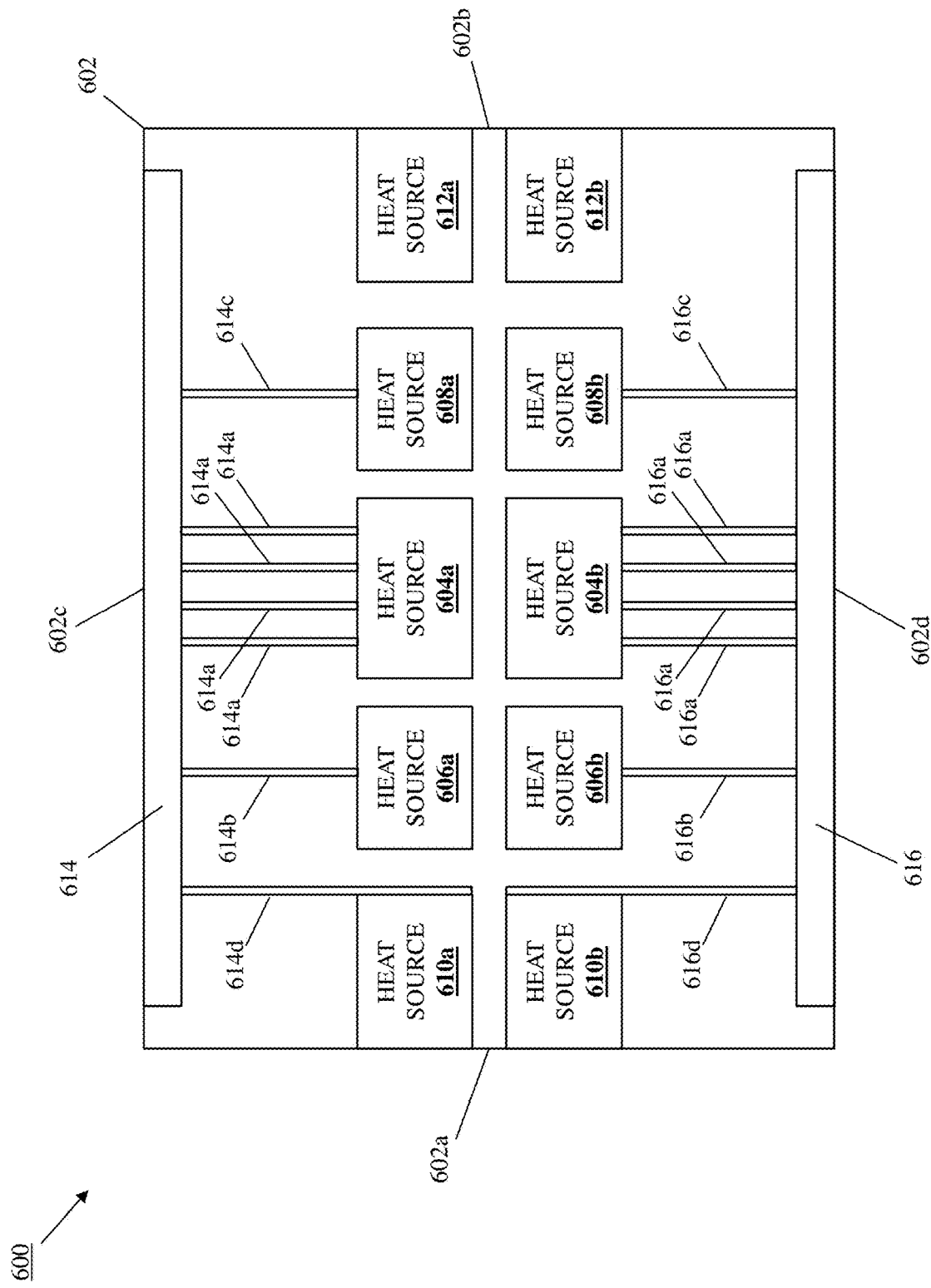
FIG. 6 is a schematic view illustrating an embodiment of a server device that may provide a computing device that may be housed in the multi-device chassis of FIG. 2.

With reference to FIG. 6, an embodiment of a server device 600 is illustrated that may provide any of the computing devices 204a-204d discussed above with reference to FIG. 2. As such, the server device 600 may be provided by the IHS 100 discussed above with reference to FIG. 1, and/or may include some or all of the components of the IHS 100. In the illustrated embodiment, the server device 600 includes a chassis 602 that houses the components of the server device 600, only some of which are illustrated and described below. In the illustrated embodiment, the chassis 602 includes a front surface 602a, a rear surface 602b that is located opposite the chassis 602 from the front surface 602a, and a pair of side surfaces 602c and 602d that extend between the front surface 602a and the rear surface 602b and that are located opposite the chassis 602 from each other. As illustrated, the chassis 602 houses a plurality of heat sources 604a and 604b (e.g., processing systems such as Central Processing Units (CPUs)), a plurality of heat sources 606a, 606n, 608a, and 608b (e.g., memory systems such as Dual Inline Memory Modules (DIMMs)), a plurality of heat sources 610a and 610b (e.g., storage systems such as Hard Disk Drives (HDDs), Solid State Drives (SSDs), etc.), and a plurality of heat sources 612b and 612b (e.g., power systems such as Power Supply Units (PSUs)).

As illustrated in FIG. 6, the chassis 602 may include a "cool plate" 614 (e.g., a heat sink) that may be provided by (or adjacent) the side wall 602c of the chassis 602, and a "cool plate" 616 (e.g., a heat sink) that may be provided by (or adjacent) the side wall 602d of the chassis 602. In the illustrated embodiment, the cool plate 614 is coupled to the heat source 604a by heat transfer elements 614a (e.g., heat pipes), to the heat source 606a by a heat transfer element 614b (e.g., a heat pipe), to the heat source 608a by a heat transfer element 614c (e.g., a heat pipe), and to the heat source 610a by a heat transfer element 614d (e.g., a heat pipe). Similarly, the cool plate 616 is coupled to the heat source 604b by heat transfer elements 616a (e.g., heat pipes), to the heat source 606b by a heat transfer element 616b (e.g., a heat pipe), to the heat source 608b by a heat transfer element 616c (e.g., a heat pipe), and to the heat source 610b by a heat transfer element 616d (e.g., a heat pipe). As would be appreciated by one of skill in the art in possession of the present disclosure, rather than the specific cooling configuration illustrated in FIG. 6, one or more heats sink may engage one or more of the heat sources in the server device 600 and the side walls 602c and 602d of the chassis 602 in order to transfer heat generated by those heat sources to the side walls 602c and 602d.

As will be appreciated by one of skill in the art in possession of the present disclosure, the heat sources 612a and 612b are not illustrated as being connected to the cool plates 614 and 616, which provides an example of how the multi-device-chassis/device movable coupling liquid cooling system of the present disclosure may only be utilized to cool particular components in a computing device. For example, the cool plates 614 and 616 in the server device 600 may be configured to only dissipate heat that is generated by relatively high heat generating components (e.g., CPUs and DIMMs) to the multi-device-chassis/device movable coupling liquid cooling system of the present disclosure, and may allow other cooling techniques to be utilized for heat generated by relatively low heat generating components (e.g., radiative cooling, convective cooling using fan systems, etc.). Furthermore, some components (e.g., like the PSUs providing the heat sources 612a and 612b in FIG. 6) may include integrated cooling systems (e.g., fans), and thus may not require any heat dissipation from the multi-device-chassis/device movable coupling liquid cooling system of the present disclosure. However, while a specific component cooling configuration is illustrated in FIG. 6, one of skill in the art in possession of the present disclosure will recognize how the server device 600 may be configured to dissipate heat that is generated by any or all of its components to the multi-device-chassis/device movable coupling liquid cooling system of the present disclosure while remaining within its scope as well.

Figure 7:
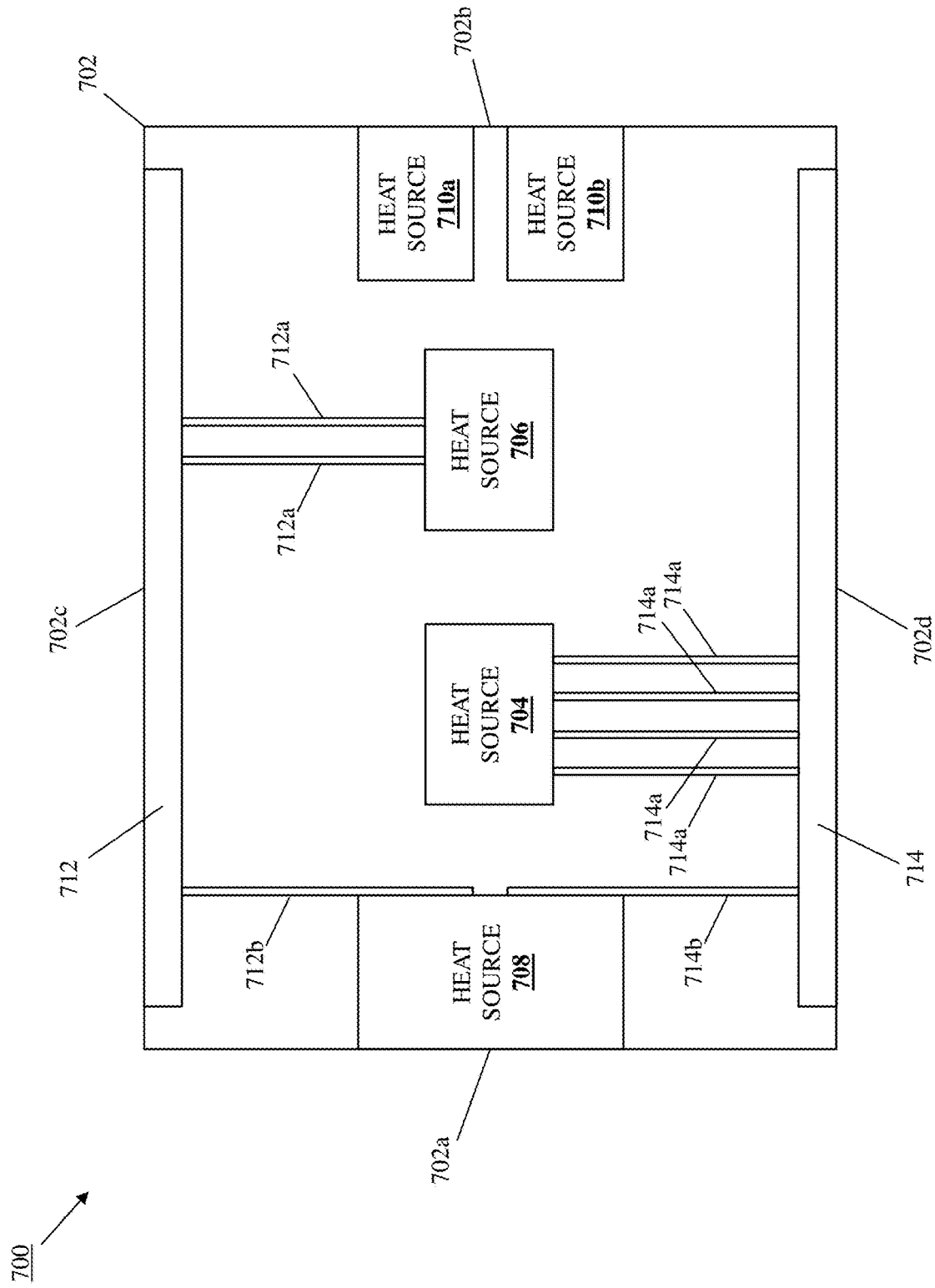
FIG. 7 is a schematic view illustrating an embodiment of a networking device that may provide a computing device that may be housed in the multi-device chassis of FIG. 2.

With reference to FIG. 7, an embodiment of a networking device 700 (e.g., a switch device) is illustrated that may provide any of the computing devices 204a-204d discussed above with reference to FIG. 2. As such, the networking device 700 may be provided by the IHS 100 discussed above with reference to FIG. 1, and/or may include some or all of the components of the IHS 100. In the illustrated embodiment, the networking device 700 includes a chassis 702 that houses the components of the networking device 700, only some of which are illustrated and described below. In the illustrated embodiment, the chassis 702 includes a front surface 702a, a rear surface 702b that is located opposite the chassis 702 from the front surface 702a, and a pair of side surfaces 702c and 702d that extend between the front surface 702a and the rear surface 702b and that are located opposite the chassis 702 from each other. As illustrated, the chassis 702 houses a heat source 704 (e.g., a network processing system such as a Network Processing Unit (NPU)), a heat source 706 (e.g., a central processing system such as a Central Processing Unit (CPU)), a heat source 708 (e.g., a communication system such as an optical communication system), and a plurality of heat sources 710a and 710b (e.g., power systems such as Power Supply Units (PSUs)).

As illustrated in FIG. 7, the chassis 702 may include a "cool plate" 712 (e.g., a heat sink) that may be provided by (or adjacent) the side wall 702c of the chassis 702, and a "cool plate" 714 "e.g., a heat sink) that may be provided by (or adjacent) the side wall 702d of the chassis 702. In the illustrated embodiment, the cool plate 712 is coupled to the heat source 704 by heat transfer elements 712a (e.g., heat pipes), and to the heat source 708 by a heat transfer element 712b (e.g., a heat pipe). Similarly, the cool plate 714 is coupled to the heat source 704 by heat transfer elements 714a (e.g., heat pipes), and to the heat source 708 by a heat transfer element 714b (e.g., a heat pipe). As would be appreciated by one of skill in the art in possession of the present disclosure, rather than the specific cooling configuration illustrated in FIG. 7, one or more heats sink may engage one or more of the heat sources in the networking device 700 and the side walls 702c and 702d of the chassis 702 in order to transfer heat generated by those heat sources to the side walls 702c and 702d.

Similarly to the server device 600 discussed above, the heat sources 710a and 710b in the networking device 700 are not illustrated as being connected to the cool plates 712 and 714, which provides an example of how the multi-device-chassis/device movable coupling liquid cooling system of the present disclosure may only be utilized to cool particular components in a computing device. For example, the cool plates 710a and 710b in the networking device 700 may be configured to only dissipate heat that is generated by relatively high heat generating components (e.g., the NPU and optics) to the multi-device-chassis/device movable coupling liquid cooling system of the present disclosure, and may allow other cooling techniques (e.g., radiative cooling, convective cooling using fan systems, etc.) to be utilized for heat generated by relatively low heat generating components. Furthermore, some components (e.g., like the PSUs providing the heat sources 710a and 710b in FIG. 7) may include integrated cooling systems (e.g., fans), and thus may not require any heat dissipation from the multi-device-chassis/device movable coupling liquid cooling system of the present disclosure. However, while a specific component cooling configuration is illustrated in FIG. 7, one of skill in the art in possession of the present disclosure will recognize how the networking device 700 may be configured to dissipate heat that is generated by any or all of its components to the multi-device-chassis/device movable coupling liquid cooling system of the present disclosure while remaining within its scope.

Figure 8:
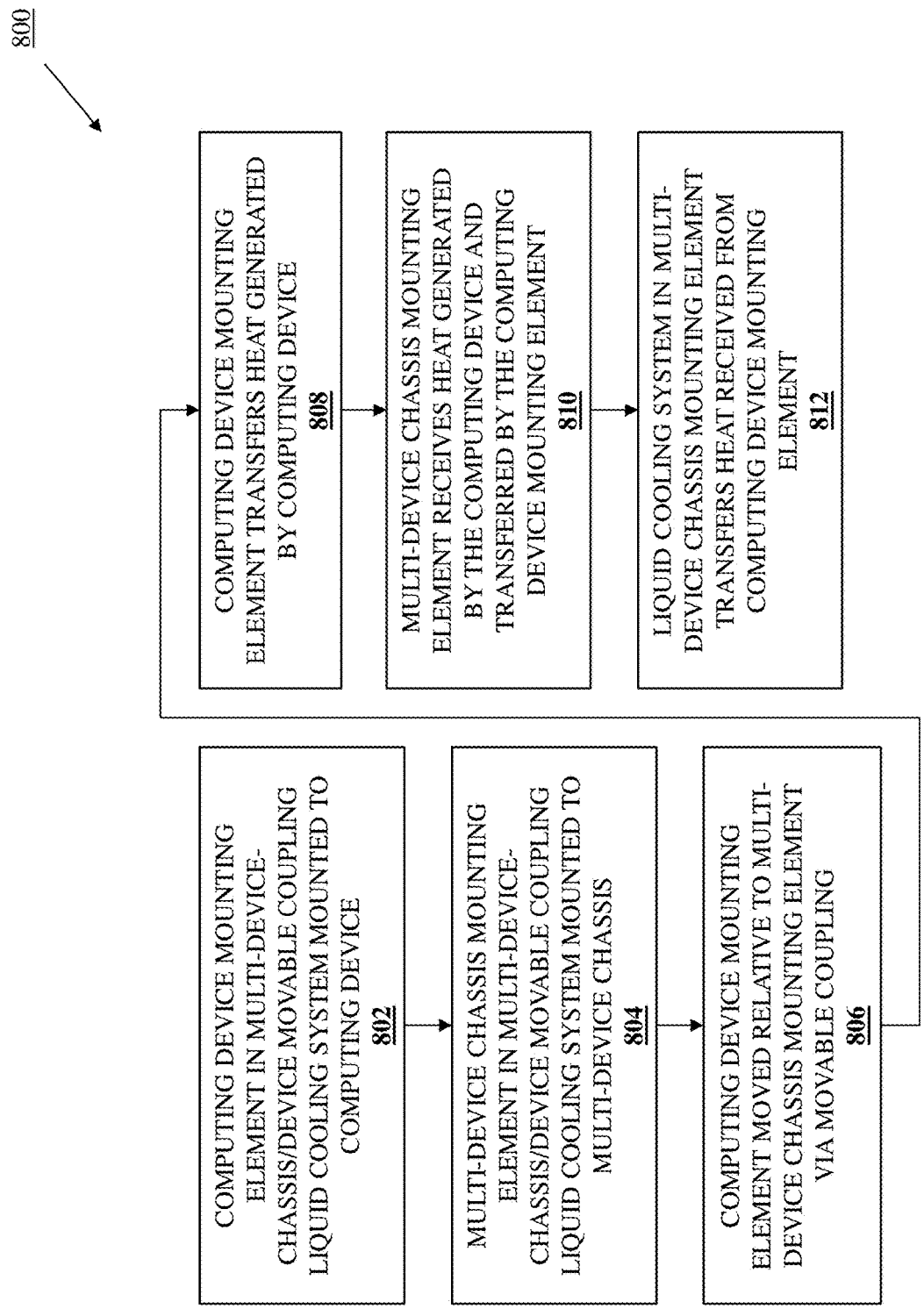
FIG. 8 is a flow chart illustrating an embodiment of a method for liquid cooling a computing device via a multi-device-chassis/device movable coupling.

Referring now to FIG. 8, an embodiment of a method 800 for liquid cooling a computing device via a multi-device-chassis/device movable coupling is illustrated. As discussed below, the systems and methods of the present disclosure provide liquid cooling subsystems in multi-device-chassis/device movable coupling systems that movably couple computing devices to a multi-device chassis, and allow heat generated by the computing devices to be dissipated via the surfaces on those computing devices that engage their multi-device-chassis/device movable coupling system and using the liquid cooling subsystem in that multi-device-chassis/device movable coupling system. For example, the computing device liquid cooling system of the present disclosure may include a multi-device chassis, a computing device, and a multi-device-chassis/device movable coupling liquid cooling system that moveably couples the computing device to the multi-device chassis. The multi-device-chassis/device movable coupling liquid cooling system includes a computing device mounting element that is mounted to the computing device and configured to transfer heat generated by the computing device, a multi-device chassis mounting element that includes a liquid cooling subsystem and that is mounted to the multi-device chassis, and a movable coupling that is configured to allow the computing device mounting element to move relative to the multi-device chassis mounting element. The multi-device chassis mounting element is configured to receive the heat generated by the computing device and transferred by the computing device mounting element, and transfer the heat received from the computing device mounting element using the liquid cooling subsystem. As such, liquid cooling may be provided on a per-computing-device basis in a multi-device chassis while eliminating issues associated with providing liquid cooling systems in the chassis of those computing devices, and may reduce the number, size, or level of operation (and associated noise) of any cooling systems provided in computing devices utilized in multi-device chassis.

Figure 9:
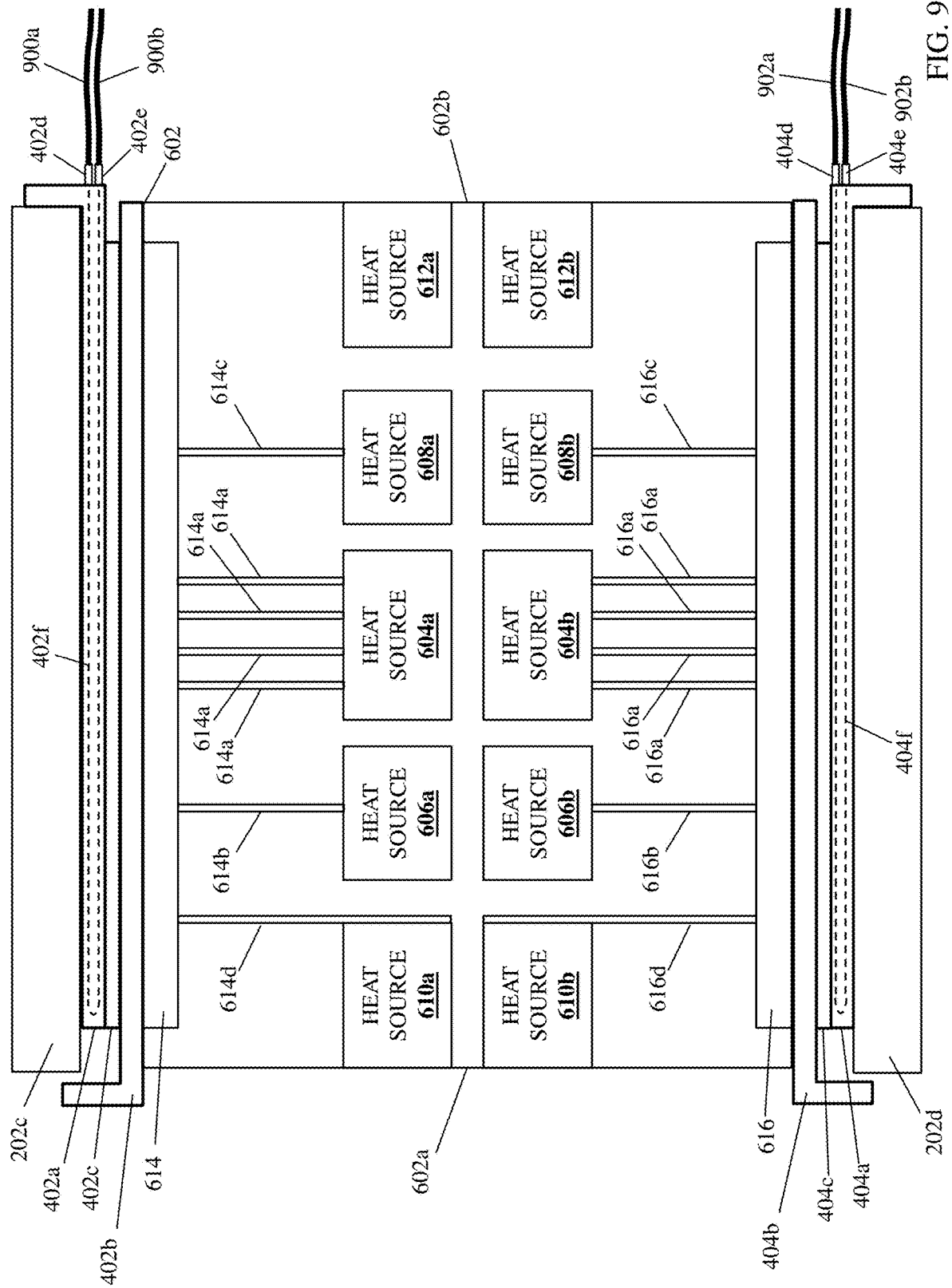
FIG. 9 is a schematic view illustrating an embodiment of the server device of FIG. 6 mounted to the multi-device chassis of FIG. 2 via the multi-device-chassis/device movable coupling liquid cooling system of FIG. 4.

The method 800 begins at block 802 where a computing device mounting element in a multi-device-chassis/device movable coupling liquid cooling system is mounted to a computing device. With reference to FIG. 9, in an embodiment of block 802, the computing device mounting elements 402b and 404b on the multi-device-chassis/device movable coupling liquid cooling subsystems 402 and 404, respectively (discussed above with reference to FIG. 4), may be mounted to the server device 600 discussed above with reference to FIG. 6. For example, the computing device mounting element 402b may be mounted to the side surface 602c of the chassis 602 on the server device 600, and the computing device mounting element 404b may be mounted to the side surface 602d of the chassis 602 on the server device 600, using screws or other tooled fasteners known in the art, tabs or other toolless fasteners known in the art, and/or using any other mounting techniques that one of skill in the art in possession of the present disclosure would recognize as securing the multi-device-chassis/device movable coupling liquid cooling subsystems 402 and 404 to the chassis 602 of the server device 600. Furthermore, while not illustrated, one of skill in the art in possession of the present disclosure will appreciate how thermal interface materials may be provided between the computing device mounting elements 402b and 404b and the side surfaces 602c and 602d, respectively, of the chassis 602 on the server device 600 in order to, for example, enhance heat transfer from the server device 600 to the computing device mounting elements 402b and 404b.

Figure 10:
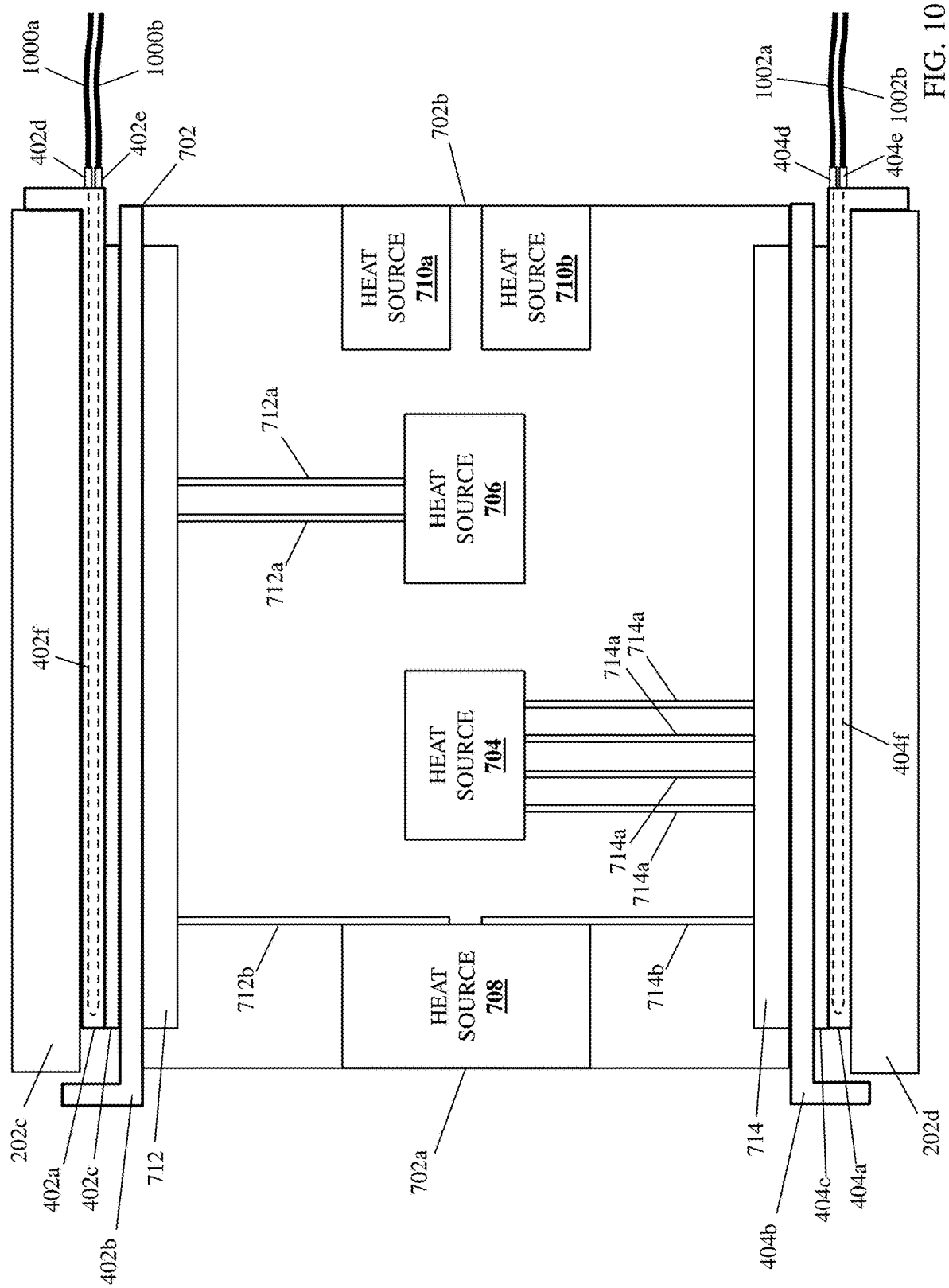
FIG. 10 is a schematic view illustrating an embodiment of the networking device of FIG. 7 mounted to the multi-device chassis of FIG. 2 via the multi-device-chassis/device movable coupling liquid cooling system of FIG. 4.

Similarly, with reference to FIG. 10, in an embodiment of block 802, the computing device mounting elements 402b and 404b on the multi-device-chassis/device movable coupling liquid cooling subsystems 402 and 404, respectively (discussed above with reference to FIG. 4), may be mounted to the networking device 700 discussed above with reference to FIG. 7. For example, the computing device mounting element 402b may be mounted to the side surface 702c of the chassis 702 on the networking device 700, and the computing device mounting element 404b may be mounted to the side surface 702d of the chassis 702 on the networking device 700, using screws or other tooled fasteners known in the art, tabs or other toolless fasteners known in the art, and/or using any other mounting techniques that one of skill in the art in possession of the present disclosure would recognize as securing the multi-device-chassis/device movable coupling liquid cooling subsystems 402 and 404 to the chassis 702 of the networking device 700. Furthermore, while not illustrated, one of skill in the art in possession of the present disclosure will appreciate how thermal interface materials may be provided between the computing device mounting elements 402b and 404b and the side surfaces 702c and 702d, respectively, of the chassis 602 on the networking device 700 in order to, for example, enhance heat transfer from the networking device 700 to the computing device mounting elements 402b and 404b.

However, while a specific example of the mounting of the computing device mounting elements 402b and 404b on the multi-device-chassis/device movable coupling liquid cooling subsystems 402 and 404 to particular computing devices has been illustrated and described, one of skill in the art in possession of the present disclosure will recognize how the computing device mounting elements 402b and 404b on the multi-device-chassis/device movable coupling liquid cooling subsystems 402 and 404 may be mounted to a variety of computing devices (e.g., storage systems, etc.) while remaining within the scope of the present disclosure as well.

The method 800 then proceeds to block 804 where a multi-device chassis mounting element in a multi-device-chassis/device movable coupling liquid cooling system is mounted to a multi-device chassis. With reference back to FIG. 9, in an embodiment of block 804, the multi-device chassis mounting elements 402a and 404a on the multi-device-chassis/device movable coupling liquid cooling subsystems 402 and 404, respectively (discussed above with reference to FIG. 4), may be mounted to the multi-device chassis 200 discussed above with reference to FIG. 2. For example, the multi-device chassis mounting element 402a may be mounted to the side wall 202c of the rack 202 providing the multi-device chassis 200, and the multi-device chassis mounting element 404a may be mounted to the side wall 202d of the rack 202 providing the multi-device chassis 200, using screws or other tooled fasteners known in the art, tabs or other toolless fasteners known in the art, and/or using any other mounting techniques that one of skill in the art in possession of the present disclosure would recognize as securing the multi-device-chassis/device movable coupling liquid cooling subsystems 402 and 404 to the multi-device chassis 200.

Similarly, with reference back to FIG. 10, in an embodiment of block 804, the multi-device chassis mounting elements 402a and 404a on the multi-device-chassis/device movable coupling liquid cooling subsystems 402 and 404, respectively (discussed above with reference to FIG. 4), may be mounted to the multi-device chassis 200 discussed above with reference to FIG. 2. For example, the multi-device chassis mounting element 402a may be mounted to the side wall 202c of the rack 202 providing the multi-device chassis 200, and the multi-device chassis mounting element 404a may be mounted to the side wall 202d of the rack 202 providing the multi-device chassis 200, using screws or other tooled fasteners known in the art, tabs or other toolless fasteners known in the art, and/or using any other mounting techniques that one of skill in the art in possession of the present disclosure would recognize as securing the multi-device-chassis/device movable coupling liquid cooling subsystems 402 and 404 to the multi-device chassis 200. However, while a specific example of the mounting of the multi-device chassis mounting elements 402a and 404a on the multi-device-chassis/device movable coupling liquid cooling subsystems 402 and 404 to a particular multi-device chassis has been illustrated and described, one of skill in the art in possession of the present disclosure will recognize how the multi-device chassis mounting elements 402a and 404a on the multi-device-chassis/device movable coupling liquid cooling subsystems 402 and 404 may be mounted to a variety of multi-device chassis while remaining within the scope of the present disclosure as well.

With the multi-device-chassis/device movable coupling liquid cooling system 400 mounted to both the computing device and the multi-device chassis 200, a plurality of liquid conduits may be provided to couple a liquid provisioning system to the liquid cooling subsystems in the multi-device chassis mounting element 402a and 404a. As will be appreciated by one of skill in the art in possession of the present disclosure, a liquid provisioning system (not illustrated) may be provided in or adjacent the multi-device chassis 200, and may include a liquid reservoir, liquid cooling devices (e.g., redundant heat exchangers), liquid filters, liquid pumps, and/or any other liquid provisioning components that one of skill in the art in possession of the present disclosure will recognize as providing for the liquid cooling described below. Furthermore, the liquid provisioning system and/or at least some of its components may be positioned adjacent a bottom of the multi-device chassis 200, while the multi-device chassis 200 may be provided with "drip trays" and/or other liquid channeling devices, in order to prevent liquid damage to the computing devices in the multi-device chassis 200 in the event of a leak in any portion of the liquid provisioning system or liquid cooling subsystems provided therewith.

As such, with reference back to FIG. 9, the liquid provisioning system may be connected to the liquid inlet 402d and the liquid outlet 402e on the multi-device chassis mounting element 402a via respective liquid conduits 900a and 900b (e.g., tubing), as well as connected to the liquid inlet 404d and the liquid outlet 404e on the multi-device chassis mounting element 404a via respective liquid conduits 902a and 902b (e.g., tubing). Similarly, with reference back to FIG. 10, a liquid provisioning system (not illustrated) may be connected to the liquid inlet 402d and the liquid outlet 402e on the multi-device chassis mounting element 402a via respective liquid conduits 1000a and 1000b (e.g., tubing), as well as connected to the liquid inlet 404d and the liquid outlet 404e on the multi-device chassis mounting element 404a via respective liquid conduits 1002a and 1002b (e.g., tubing).

Figure 11:
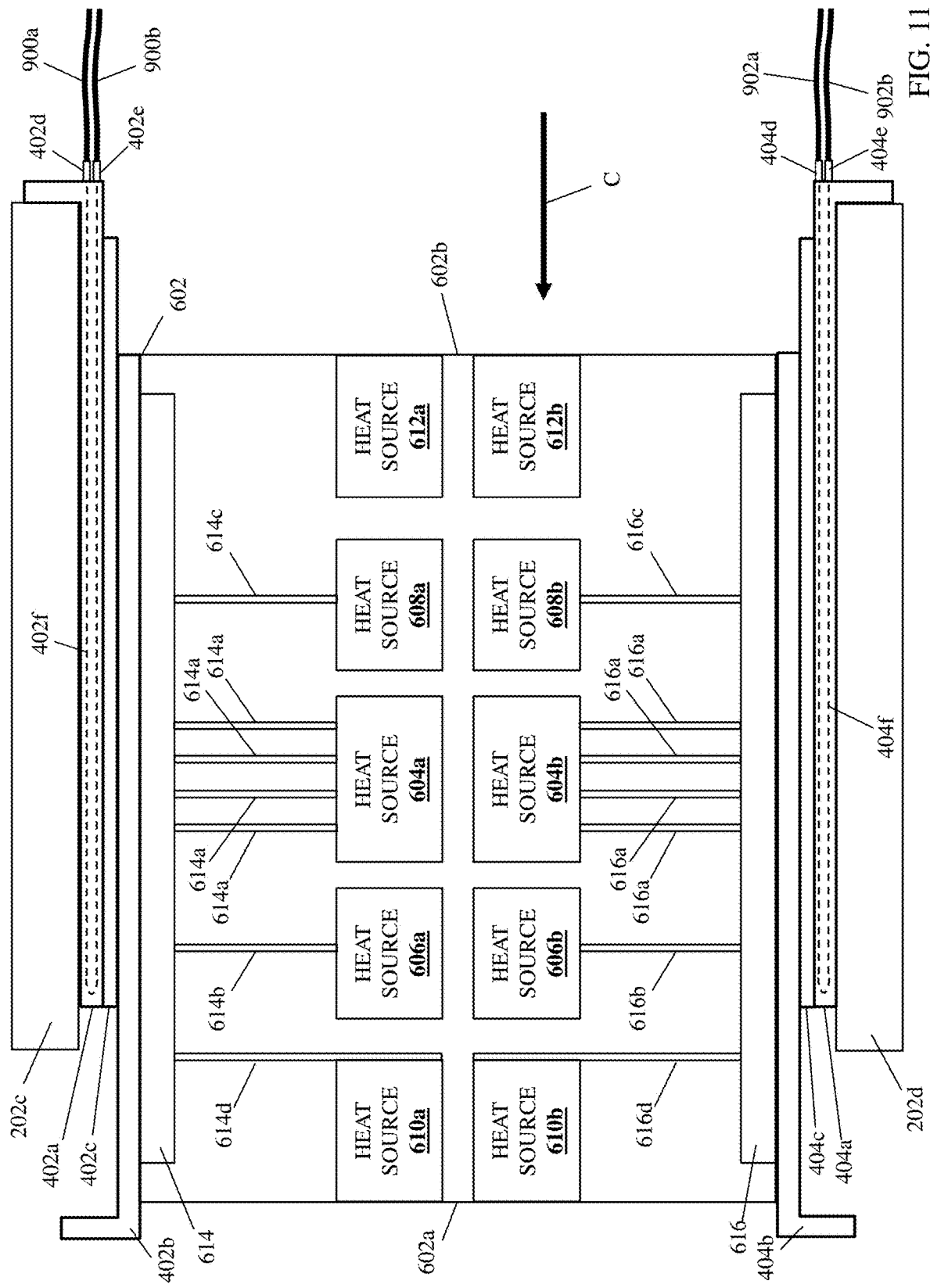
FIG. 11 is a schematic view illustrating an embodiment of the server device mounted to the multi-device chassis via the multi-device-chassis/device movable coupling liquid cooling system of FIG. 9, with the server device moved relative to the multi-device chassis via the multi-device-chassis/device movable coupling liquid cooling system.

The method 800 then proceeds to block 806 where the computing device mounting element is moved relative to the multi-device chassis mounting element via a movable coupling. With reference to FIGS. 9 and 11, in an embodiment of block 806, a force may be provided on the server device 600 and/or the computing device mounting element(s) 402b and 404b (e.g., by "pulling" the server device 600 and/or the computing device mounting element(s) 402b and 404b from the housing defined by the multi-device chassis 200) in order to move the server device 600 and the computing device mounting elements 402b and 404b relative to the multi-device chassis mounting elements 402a and 404a and the multi-device chassis 200 and in a direction C such that the server device 600 and the computing device mounting elements 402b and 404b extend from the housing defined by the multi-device chassis 200. With reference back to FIG. 4, one of skill in the art in possession of the present disclosure will appreciate how the movement in the direction C provides for movement of each of the computing device mounting elements 402b and 404b relative to the multi-device chassis mounting elements 402a and 404a, respectively, along their respective axis A that is parallel to the respective axis B of the multi-device chassis mounting elements 402a and 404a, respectively.

Figure 12:
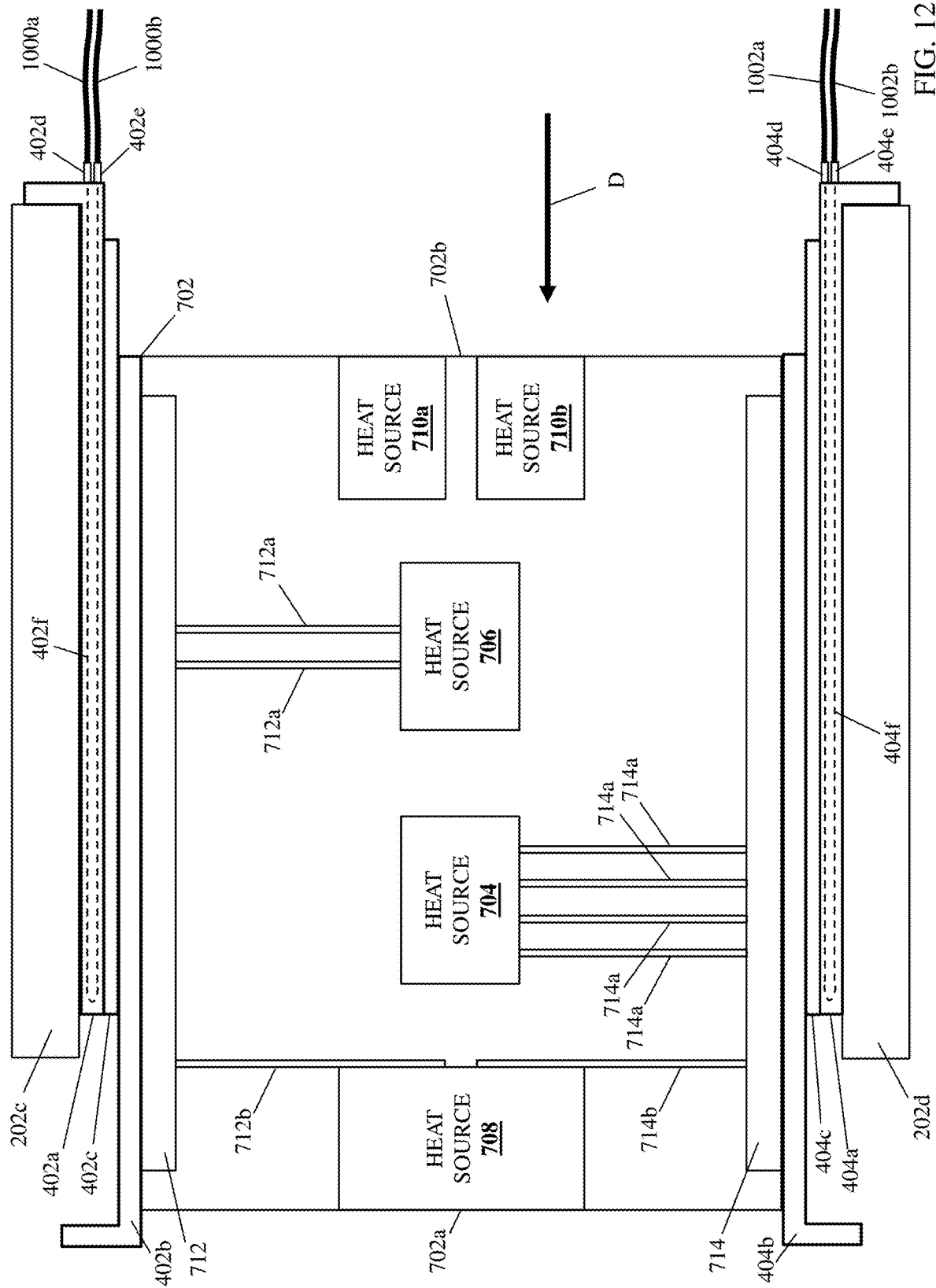
FIG. 12 is a schematic view illustrating an embodiment of the networking device mounted to the multi-device chassis via the multi-device-chassis/device movable coupling liquid cooling system of FIG. 10, with the networking device moved relative to the multi-device chassis via the multi-device-chassis/device movable coupling liquid cooling system.

Similarly, with reference to FIGS. 10 and 12, in an embodiment of block 806, a force may be provided on the networking device 700 and/or the computing device mounting element(s) 402b and 404b (e.g., by "pulling" the networking device 700 and/or the computing device mounting element(s) 402b and 404b from the housing defined by the multi-device chassis 200) in order to move the networking device 700 and the computing device mounting elements 402b and 404b relative to the multi-device chassis mounting elements 402a and 404a and the multi-device chassis 200 and in a direction D such that the networking device 700 and the computing device mounting elements 402b and 404b extend from the housing defined by the multi-device chassis 200. With reference back to FIG. 4, one of skill in the art in possession of the present disclosure will appreciate how the movement in the direction D provides for movement of each of the computing device mounting elements 402b and 404b relative to the multi-device chassis mounting elements 402a and 404a, respectively, along their respective axis A that is parallel to the respective axis B of the multi-device chassis mounting elements 402a and 404a, respectively. As such, one of skill in the art in possession of the present disclosure will appreciate how the multi-device-chassis/device movable coupling liquid cooling subsystems 402 and 404 in the multi-device-chassis/device movable coupling liquid cooling subsystem 400 provide for movement of computing devices (e.g., the server device 600 or networking device 700) relative to the multi-device chassis 200 in order to, for example, allow those computing devices to be "slid" in and out of a rack.

The method 800 then proceeds to block 808 where the computing device mounting element transfers heat generated by the computing device. With reference to back to FIG. 9, in an embodiment of block 808, the operation of the server device 600 may generate heat. For example, the heat generated at block 808 by the server device 600 may result from the operation of any of the heat sources 604a and 604b, the heat sources 606a, 606b, 608a, and 608b, and the heat sources 610a and 610b. Furthermore, one of skill in the art in possession of the present disclosure will appreciate how heat generated via the operation of the heat sources 604a and 604b may be transferred by the heat transfer elements 614a and 616a, respectively, to the cool plates 614 and 616, respectively. Similarly, the heat generated via the operation of the heat sources 606a/608a and 606b/608b may be transferred by the heat transfer elements 614b/614c, and 616b/616c, respectively, to the cool plates 614 and 616, respectively. Similarly, the heat generated via the operation of the heat sources 610a and 610b may be transferred by the heat transfer elements 614d and 616d, respectively, to the cool plates 614 and 616, respectively.

As will be appreciated by one of skill in the art in possession of the present disclosure, any heat generated via the operation of the server device 600 and transferred to the cool plates 614 and 616 will then be transferred from the cool plates 614 and 616 to the computing device mounting elements 402b and 404b, respectively, via the engagement of the computing device mounting elements 402b and 404b and the side surfaces 602c and 602d, respectively, of the chassis 602 of the server device 600. Furthermore, one of skill in the art in possession of the present disclosure will also recognize how heat transferred to the computing device mounting elements 402b and 404b will be transferred by those computing device mounting elements 402b and 404b towards the thermal interface materials 402c and 404c, respectively.

Similarly, with reference to back to FIG. 10, in an embodiment of block 808, the operation of the networking device 700 may generate heat. For example, the heat generated at block 808 by the networking device 700 may result from the operation of any of the network heat source 704, the heat source 706, and the heat source 708. Furthermore, one of skill in the art in possession of the present disclosure will appreciate how heat generated via the operation of the heat source 704 may be transferred by the heat transfer elements 714a to the cool plate 714. Similarly, the heat generated via the operation of the heat source 706 may be transferred by the heat transfer elements 712a to the cool plate 712. Similarly, the heat generated via the operation of the heat source 708 may be transferred by the heat transfer elements 712b and 714b, respectively, to the cool plates 712 and 714, respectively.

As will be appreciated by one of skill in the art in possession of the present disclosure, any heat generated via the operation of the networking device 700 and transferred to the cool plates 712 and 714 will then be transferred from the cool plates 712 and 714 to the computing device mounting elements 402b and 404b, respectively, via the engagement of the computing device mounting elements 402b and 404b and the side surfaces 702c and 702d, respectively, of the chassis 702 of the networking device 700. Furthermore, one of skill in the art in possession of the present disclosure will also recognize how heat transferred to the computing device mounting elements 402b and 404b will be transferred by those computing device mounting elements 402b and 404b towards the thermal interface materials 402c and 404c, respectively.

The method 800 then proceeds to block 810 where the multi-device chassis mounting element receives heat generated by the computing device and transferred by the computing device mounting element. With reference to back to FIG. 9, in an embodiment of block 810, the heat transferred by the computing device mounting elements 402b and 404b towards the thermal interface materials 402c and 404c, respectively, will move through the thermal interface materials 402c and 404c such that it is received by the multi-device chassis mounting elements 402a and 404a, respectively. Similarly, with reference to back to FIG. 10, in an embodiment of block 810, the heat transferred by the computing device mounting elements 402b and 404b towards the thermal interface materials 402c and 404c, respectively, will move through the thermal interface materials 402c and 404c such that it is received by the multi-device chassis mounting elements 402a and 404a, respectively.

The method 800 then proceeds to block 812 where a liquid cooling system in the multi-device mounting element transfers the heat received from the computing device mounting element. With reference to back to FIG. 9, in an embodiment of block 812, the liquid cooling systems included in the multi-device chassis mounting elements 402a and 404a may receive a liquid having a first, relatively lower temperature via the liquid conduits 900a and 902a, respectively, and the liquid inlets 402d and 404d, respectively. That liquid may then circulate through the liquid conduits 402f and 404f, respectively, that are defined by the multi-device chassis mounting elements 402*a* and 404*a*, respectively, and one of skill in the art in possession of the present disclosure will appreciate how the heat received by the multi-device chassis mounting elements 402*a* and 404*a* will be transferred to the liquid that circulates through the liquid conduits 402*f* and 404*f*, respectively, that are defined by those multi-device chassis mounting elements 402*a* and 404*a*, respectively. As such, the liquid may then reach the end of the liquid conduits 402*f* and 404*f* that are defined by the multi-device chassis mounting elements 402*a* and 404*a*, respectively, and be expelled via the liquid outlets 402*e* and 404*e*, respectively, included on the multi-device chassis mounting elements 402*a* and 404*a*, respectively, and through the liquid conduits 900*b* and 902*b*, respectively, at a second, relatively higher temperature (i.e., relative to the first relatively lower temperature at which it entered the liquid cooling subsystems). Thus, one of skill in the art in possession of the present disclosure will appreciate how the heat generated by the server device 600 will be dissipated via the liquid cooling subsystem provided in the multi-device-chassis/device movable coupling liquid cooling system 400.

Similarly, with reference to back to FIG. 10, in an embodiment of block 812, the liquid cooling systems included in the multi-device chassis mounting elements 402*a* and 404*a* may receive a liquid having a first, relatively lower temperature via the liquid conduits 1000*a* and 1002*a*, respectively, and the liquid inlets 402*d* and 404*d*, respectively. That liquid may then circulate through the liquid conduits 402*f* and 404*f*, respectively, that are defined by the multi-device chassis mounting elements 402*a* and 404*a*, respectively, and one of skill in the art in possession of the present disclosure will appreciate how the heat received by the multi-device chassis mounting elements 402*a* and 404*a* will be transferred to the liquid that circulates through the liquid conduits 402*f* and 404*f*, respectively, that are defined by those multi-device chassis mounting elements 402*a* and 404*a*, respectively. As such, the liquid may then reach the end of the liquid conduits 402*f* and 404*f* that are defined by the multi-device chassis mounting elements 402*a* and 404*a*, respectively, and be expelled via the liquid outlets 402*e* and 404*e*, respectively, included on the multi-device chassis mounting elements 402*a* and 404*a*, respectively, and through the liquid conduits 1000*b* and 1002*b*, respectively, at a second, relatively higher temperature (i.e., relative to the first relatively lower temperature at which it entered the liquid cooling subsystems). Thus, one of skill in the art in possession of the present disclosure will appreciate how the heat generated by the networking device 700 will be dissipated via the liquid cooling subsystem provided in the multi-device-chassis/device movable coupling liquid cooling system 400.

Figure 13:
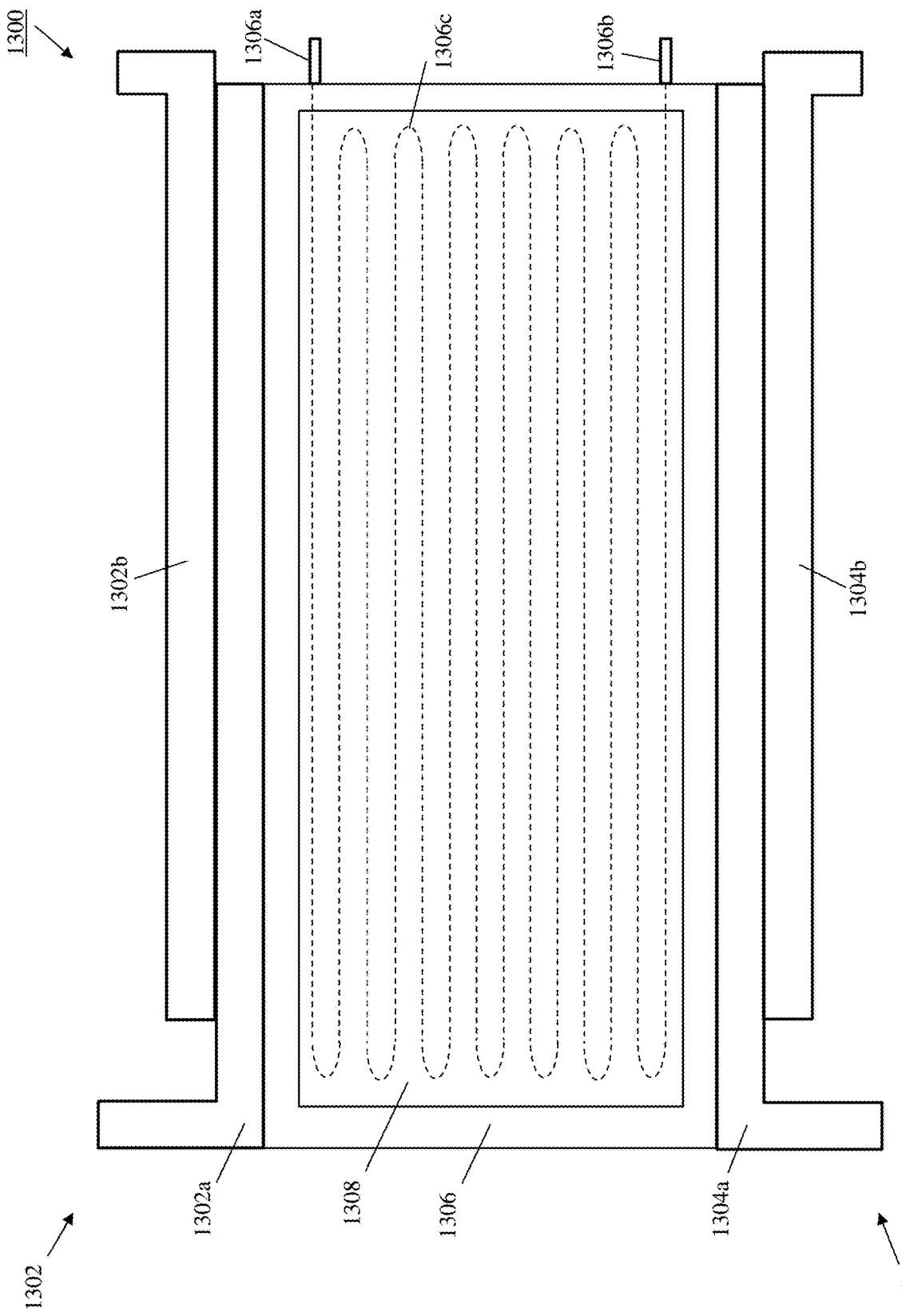
FIG. 13 is a is a schematic view illustrating an embodiment of a multi-device-chassis/device movable coupling liquid cooling system.

While a specific example of the multi-device-chassis/device movable coupling liquid cooling system of the present disclosure is illustrated and described above, one of skill in the art in possession of the present disclosure will appreciate how a wide variety of other configurations of the multi-device-chassis/device movable coupling liquid cooling system of the present disclosure will fall within its scope as well. For example, FIG. 13 illustrates an embodiment of a multi-device-chassis/device movable coupling liquid cooling system 1300 that includes a multi-device-chassis/device movable coupling subsystem 1302 having a computing device mounting element 1302*a* and a multi-device chassis mounting element 1302*b* that are configured to move relative to each other similarly as discussed above, and a multi-device-chassis/device movable coupling subsystem 1304 having a computing device mounting element 1304*a* and a multi-device chassis mounting element 1304*b* that are configured to move relative to each other similarly as discussed above. A computing device support tray 1306 extends between the computing device mounting element 1302*a* and 1304*a*, and may include a liquid inlet 1306*a* and a liquid outlet 1306*a* that are each connected to a liquid conduit 1306*c* defined by the computing device support tray 1306 and extending through the computing device support tray 1306 (as illustrated by the dashed line in FIG. 13). A thermal interface material 1308 may be provided on the computing device support tray 1306 as well.

As will be appreciated by one of skill in the art in possession of the present disclosure, a computing device may be positioned on the computing device support tray 1306 in engagement with the thermal interface material 1308, and may be mounted to each of the computing device mounting elements 1302*a* and 1304*a* similarly as described above. The multi-device chassis mounting elements 1302*b* and 1304*b* may then be mounted to side walls of a multi-device chassis similarly as described above, and the movable coupling of the computing device mounting element 1302*a*/multi-device chassis mounting element 1302*b* and the computing device mounting element 1304*a*/multi-device chassis mounting element 1304*b* will allow movement of the computing device, the computing device support tray 1306, and the computing device mounting elements 1302*a* and 1304*a* in and out of a rack similarly as described above. Furthermore, liquid may be circulated through the liquid conduit 1306*c* in the computing device support tray 1306 in order to dissipate heat generated by the computing device and transferred via the thermal interface material 1308 to the computing device support tray 1306 similarly as described above.

As will be appreciated by one of skill in the art in possession of the present disclosure, the multi-device-chassis/device movable coupling liquid cooling system 1300 may be modified in a variety of manners that will fall within the scope of the present disclosure as well. For example, while the liquid conduit 1306*c* is illustrated as being distributed across the computing device support tray 1306 evenly, the liquid conduit may be "focused" to provide relatively more liquid flow in particular areas of the computing device support tray 1306 that may correspond to locations that engage surfaces on the computing device that are immediately adjacent heat sources/heat producing components such as the processing systems, memory systems, storage systems, communication systems, and/or other heat sources/heat producing components described here. Furthermore, while no liquid cooling subsystem is illustrated as being included in the multi-device chassis mounting elements 1304*a* and 1304*b*, liquid cooling subsystems may be provided in the multi-device chassis mounting elements 1304*a* and 1304*b* (similarly as illustrated and described with reference to FIG. 4 above) in combination with the liquid cooling subsystem in the computing device support tray 1306 in order to provide a relatively high level of cooling for computing devices that produce a relatively high amount of heat. As such, a wide variety of modification to the embodiments described above is envisioned as falling within the scope of the present disclosure.

Thus, systems and methods have been described that provide liquid cooling subsystems in the multi-device-chassis/device movable coupling systems that movably couple computing devices to a multi-device chassis, and allows heat generated by the computing devices to be dissipated via the surfaces on those computing devices that engage their multi-device-chassis/device movable coupling system and using the liquid cooling subsystem in that multi-device-chassis/device movable coupling system. For example, the computing device liquid cooling system of the present disclosure may include a multi-device chassis, a computing device, and a multi-device-chassis/device movable coupling liquid cooling system that moveably couples the computing device to the multi-device chassis. The multi-device-chassis/device movable coupling liquid cooling system includes a computing device mounting element that is mounted to the computing device and configured to transfer heat generated by the computing device, a multi-device chassis mounting element that includes a liquid cooling subsystem and that is mounted to the multi-device chassis, and a movable coupling that is configured to allow the computing device mounting element to move relative to the multi-device chassis mounting element. The multi-device chassis mounting element is configured to receive the heat generated by the computing device and transferred by the computing device mounting element, and transfer the heat received from the computing device mounting element using the liquid cooling subsystem. As such, liquid cooling may be provided on a per-computing-device basis in a multi-device chassis while eliminating issues associated with providing liquid cooling systems in the chassis of those computing devices, and may reduce the number, size, or level of operation (and associated noise) of cooling systems provided in computing devices utilized in multi-device chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computing device liquid cooling system, comprising:
   a multi-device chassis;
   a computing device; and
   a multi-device-chassis/device movable coupling liquid cooling system that moveably couples the computing device to the multi-device chassis, wherein the multi-device-chassis/device movable coupling liquid cooling system includes:
      a first computing device mounting element that is mounted to a first surface of the computing device and that is configured to transfer heat generated by the computing device;
      a second computing device mounting element that is mounted to a second surface of the computing device that is opposite the computing device from the first surface and that is configured to transfer heat generated by the computing device;
      a first multi-device chassis mounting element that includes a first liquid cooling subsystem and that is mounted to a first wall of the multi-device chassis, wherein the first multi-device chassis mounting element is configured to:
         receive, from the first computing device mounting element, the heat generated by the computing device and transferred by the first computing device mounting element; and
         transfer the heat received from the first computing device mounting element using the first liquid cooling subsystem;
      a second multi-device chassis mounting element that includes a second liquid cooling subsystem and that is mounted to a second wall of the multi-device chassis that is opposite the multi-device chassis from the first wall, wherein the second multi-device chassis mounting element is configured to:
         receive, from the second computing device mounting element, the heat generated by the computing device and transferred by the second computing device mounting element; and
         transfer the heat received from the second computing device mounting element using the second liquid cooling subsystem;
      a first movable coupling including a first friction-reducing heat-transfer-enhancing subsystem that is configured to allow the first computing device mounting element to move relative to the first multi-device chassis mounting element and transfer heat generated by the computing device; and
      a second movable coupling including a second friction-reducing heat-transfer-enhancing subsystem that is configured to allow the second computing device mounting element to move relative to the second multi-device chassis mounting element and transfer heat generated by the computing device.

2. The system of claim 1, wherein the multi-device-chassis/device movable coupling liquid cooling system includes:
   a first friction-reducing thermal interface material in the first friction-reducing heat-transfer-enhancing subsystem that is provided between the first computing device mounting element and the first multi-device chassis mounting element, wherein the first friction-reducing thermal interface material is configured to transfer the heat generated by the computing device and transferred by the first computing device mounting element to the first multi-device chassis mounting element; and
   a second friction-reducing thermal interface material in the second friction-reducing heat-transfer-enhancing subsystem that is provided between the second computing device mounting element and the second multi-device chassis mounting element, wherein the second friction-reducing thermal interface material is configured to transfer the heat generated by the computing device and transferred by the second computing device mounting element to the second multi-device chassis mounting element.

3. The system of claim 2, wherein the first friction-reducing heat-transfer-enhancing subsystem in the first movable coupling defines a first channel that houses the first friction-reducing thermal interface material and provides a first slidable coupling that is configured to allow the first computing device mounting element to move relative to the first multi-device chassis mounting element via engagement with the first friction-reducing thermal interface material and along a first axis of the first computing device mounting element that is parallel to a second axis of the first multi-device chassis mounting element; and
   wherein the second friction-reducing heat-transfer-enhancing subsystem in the second movable coupling defines a second channel that houses the second friction-reducing thermal interface material and provides a second slidable coupling that is configured to allow the second computing device mounting element to move relative to the second multi-device chassis mounting element via engagement with the second friction-reducing thermal interface material and along a first axis of the second computing device mounting element that is parallel to a second axis of the second multi-device chassis mounting element.

4. The system of claim 1, wherein the first multi-device chassis mounting element engages the first surface of the computing device that provides a first heat sink for at least one heat producing component included in the computing device; and
wherein the second multi-device chassis mounting element engages the second surface of the computing device that provides a second heat sink for at least one heat producing component included in the computing device.

5. The system of claim 1, wherein the first liquid cooling subsystem in the first multi-device chassis mounting element includes a first liquid inlet that is configured to receive a liquid having a first temperature, and a first liquid outlet that is configured to expel the liquid having a second temperature that is greater than the first temperature; and
wherein the second liquid cooling subsystem in the second multi-device chassis mounting element includes a second liquid inlet that is configured to receive a liquid having a third temperature, and a second liquid outlet that is configured to expel the liquid having a fourth temperature that is greater than the third temperature.

6. The system of claim 1, further comprising:
a plurality of liquid conduits extending between a liquid provisioning system, the first liquid cooling subsystem in the first multi-device chassis mounting element, and the first liquid cooling subsystem in the first multi-device chassis mounting element.

7. The system of claim 1, wherein the multi-device chassis is a rack, and wherein the computing device is one of a server device and a networking device.

8. The system of claim 7, further comprising:
a first friction-reducing thermal interface material in the first friction-reducing heat-transfer-enhancing subsystem that is provided between the first computing device mounting element and the first multi-device chassis mounting element, wherein the first friction-reducing thermal interface material is configured to transfer the heat generated by the computing device and transferred by the first computing device mounting element to the first multi-device chassis mounting element; and
a second friction-reducing thermal interface material in the second friction-reducing heat-transfer-enhancing subsystem that is provided between the second computing device mounting element and the second multi-device chassis mounting element, wherein the second friction-reducing thermal interface material is configured to transfer the heat generated by the computing device and transferred by the second computing device mounting element to the second multi-device chassis mounting element.

9. The system of claim 8, wherein the first friction-reducing heat-transfer-enhancing subsystem in the first movable coupling defines a first channel that houses the first friction-reducing thermal interface material and provides a first slidable coupling that is configured to allow the first computing device mounting element to move relative to the first multi-device chassis mounting element via engagement with the first friction-reducing thermal interface material and along a first axis of the first computing device mounting element that is parallel to a second axis of the first multi-device chassis mounting element; and
wherein the second friction-reducing heat-transfer-enhancing subsystem in the second movable coupling defines a second channel that houses the second friction-reducing thermal interface material and provides a second slidable coupling that is configured to allow the second computing device mounting element to move relative to the second multi-device chassis mounting element via engagement with the second friction-reducing thermal interface material and along a first axis of the second computing device mounting element that is parallel to a second axis of the second multi-device chassis mounting element.

10. The system of claim 7, wherein the first multi-device chassis mounting element is configured to engage the first surface of the computing device that provides a first heat sink for at least one heat producing component included in the computing device; and
wherein the second multi-device chassis mounting element is configured to engage the second surface of the computing device that provides a second heat sink for at least one heat producing component included in the computing device.

11. The system of claim 7, wherein the first liquid cooling subsystem in the first multi-device chassis mounting element includes a first liquid inlet that is configured to receive a liquid having a first temperature, and a first liquid outlet that is configured to expel the liquid having a second temperature that is greater than the first temperature; and
wherein the second liquid cooling subsystem in the second multi-device chassis mounting element includes a second liquid inlet that is configured to receive a liquid having a third temperature, and a second liquid outlet that is configured to expel the liquid having a fourth temperature that is greater than the third temperature.

12. The system of claim 7, further comprising:
a plurality of first liquid conduits extending from the first liquid cooling subsystem in the first multi-device chassis mounting element to at least one liquid provisioning system; and
a plurality of second liquid conduits extending from the second liquid cooling subsystem in the second multi-device chassis mounting element to the at least one liquid provisioning system.

13. A multi-device-chassis/device movable coupling liquid cooling system, comprising:
a first computing device mounting element that is configured to mount to a first surface of a computing device and to transfer heat generated by the computing device;
a first multi-device chassis mounting element includes a first liquid cooling subsystem and that is configured to mount to a first wall of a multi-device chassis, wherein the first multi-device chassis mounting element is configured to:
receive, from the first computing device mounting element, the heat generated by the computing device and transferred by the first computing device mounting element; and
transfer the heat received from the first computing device mounting element using the first liquid cooling subsystem;
a first movable coupling including a first friction-reducing heat-transfer-enhancing subsystem that is configured to allow the first computing device mounting element to move relative to the first multi-device chassis mounting element and transfer heat generated by the computing device;
a second computing device mounting element that is configured to mount to a second surface of the computing device that is opposite the computing device from the first surface and that is configured to transfer heat generated by the computing device;
a second multi-device chassis mounting element includes a second liquid cooling subsystem and that is configured to mount to a second wall of the multi-device chassis, wherein the second multi-device chassis mounting element is configured to:
receive, from the second computing device mounting element, the heat generated by the computing device and transferred by the second computing device mounting element; and
transfer the heat received from the second computing device mounting element using the second liquid cooling subsystem; and
a second movable coupling including a second friction-reducing heat-transfer-enhancing subsystem that is configured to allow the second computing device mounting element to move relative to the second multi-device chassis mounting element and transfer heat generated by the computing device.

14. A method for liquid cooling a computing device via a multi-device-chassis/device movable coupling, comprising:
mounting, by a first computing device mounting element in a multi-device-chassis/device movable coupling liquid cooling system, to a first surface of a computing device;
mounting, by a second computing device mounting element in the multi-device-chassis/device movable coupling liquid cooling system, to a second surface of the computing device that is opposite the first surface;
mounting, by a first multi-device chassis mounting element in the multi-device-chassis/device movable coupling liquid cooling system, to a first wall of a multi-device chassis;
mounting, by a second multi-device chassis mounting element in the multi-device-chassis/device movable coupling liquid cooling system, to a second wall of the multi-device chassis that is opposite the first wall;
moving, by the first computing device mounting element, relative to the first multi-device chassis mounting element via a first movable coupling including a first friction-reducing heat-transfer-enhancing subsystem that allows the first computing device mounting element to move relative to the first multi-device chassis mounting element;
moving, by the second computing device mounting element, relative to the second multi-device chassis mounting element via a second movable coupling including a second friction-reducing heat-transfer-enhancing subsystem that allows the second computing device mounting element to move relative to the second multi-device chassis mounting element;
transferring, by the first computing device mounting element, heat generated by the computing device via the first friction-reducing heat-transfer-enhancing subsystem;
transferring, by the second computing device mounting element, heat generated by the computing device via the second friction-reducing heat-transfer-enhancing subsystem;
receiving, by the first multi-device chassis mounting element from the first computing device mounting element via the first friction-reducing heat-transfer-enhancing subsystem, the heat generated by the computing device and transferred by the first computing device mounting element;
receiving, by the second multi-device chassis mounting element from the second computing device mounting element via the second friction-reducing heat-transfer-enhancing subsystem, the heat generated by the computing device and transferred by the second computing device mounting element;
transferring, using a first liquid cooling subsystem included in the first multi-device chassis mounting element, the heat received from the first computing device mounting element; and
transferring, using a second liquid cooling subsystem included in the second multi-device chassis mounting element, the heat received from the second computing device mounting element.

15. The method of claim 14, further comprising:
transferring, by a first friction-reducing thermal interface material in the first friction-reducing heat-transfer-enhancing subsystem that is provided between the first computing device mounting element and the first multi-device chassis mounting element, the heat generated by the computing device and transferred by the first computing device mounting element to the first multi-device chassis mounting element; and
transferring, by a second friction-reducing thermal interface material in the second friction-reducing heat-transfer-enhancing subsystem that is provided between the second computing device mounting element and the second multi-device chassis mounting element, the heat generated by the computing device and transferred by the second computing device mounting element to the second multi-device chassis mounting element.

16. The method of claim 14, wherein the first friction-reducing heat-transfer-enhancing subsystem in the first movable coupling defines a first channel that houses the first friction-reducing thermal interface material and provides a first slidable coupling, and wherein the moving by the first computing device mounting element relative to the first multi-device chassis mounting element includes: moving, by the first computing device mounting element, relative to the first multi-device chassis mounting element via engagement with the first friction-reducing thermal interface material and along a first axis of the first computing device mounting element that is parallel to a second axis of the first multi-device chassis mounting element; and
wherein the second friction-reducing heat-transfer-enhancing subsystem in the second movable coupling defines a second channel that houses the second friction-reducing thermal interface material and provides a second slidable coupling, and wherein the moving by the second computing device mounting element relative to the second multi-device chassis mounting element includes moving, by the second computing device mounting element, relative to the second multi-device chassis mounting element via engagement with the second friction-reducing thermal interface material and along a first axis of the second computing device mounting element that is parallel to a second axis of the second multi-device chassis mounting element.

17. The method of claim 14, further comprising:
engaging, by the first multi-device chassis mounting element, the first surface of the computing device that provides a first heat sink for at least one heat producing component included in the computing device; and
engaging, by the second multi-device chassis mounting element, the second surface of the computing device that provides a second heat sink for at least one heat producing component included in the computing device.

18. The method of claim 14, further comprising:
receiving, via a first liquid inlet in the first liquid cooling subsystem in the first multi-device chassis mounting element, a liquid having a first temperature;
expelling, via a first liquid outlet in the first liquid cooling subsystem in the first multi-device chassis mounting element, the liquid having a second temperature that is greater than the first temperature; and
receiving, via a second liquid inlet in the second liquid cooling subsystem in the second multi-device chassis mounting element, a liquid having a third temperature;
expelling, via a second liquid outlet in the second liquid cooling subsystem in the second multi-device chassis mounting element, the liquid having a fourth temperature that is greater than the third temperature.

19. The method of claim 14, wherein a plurality of liquid conduits extend between a first liquid provisioning system, the first liquid cooling subsystem in the first multi-device chassis mounting element, and the second liquid cooling subsystem in the second multi-device chassis mounting element.

20. The method of claim 14, wherein the multi-device chassis is a rack, and wherein the computing device is one of a server device and a networking device.

* * * * *